(12) United States Patent
Isaka et al.

(10) Patent No.: US 7,781,308 B2
(45) Date of Patent: Aug. 24, 2010

(54) METHOD FOR MANUFACTURING SOI SUBSTRATE

(75) Inventors: Fumito Isaka, Zama (JP); Sho Kato, Isehara (JP); Ryu Komatsu, Atsugi (JP); Kosei Nei, Isehara (JP); Akihisa Shimomura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/277,352

(22) Filed: Nov. 25, 2008

(65) Prior Publication Data

US 2009/0142904 A1 Jun. 4, 2009

(30) Foreign Application Priority Data

Dec. 3, 2007 (JP) ............................. 2007-312668

(51) Int. Cl.
*H01L 21/30* (2006.01)
(52) U.S. Cl. ................. 438/458; 257/E21.568
(58) Field of Classification Search ................. 438/455, 438/458, 459
See application file for complete search history.

(56) References Cited

U.S. PATENT DOCUMENTS

| | | | |
|---|---|---|---|
| 5,371,037 A * | 12/1994 | Yonehara | ..................... 438/459 |
| 5,374,564 A | 12/1994 | Bruel | |
| 6,251,754 B1 | 6/2001 | Ohshima et al. | |
| 6,372,609 B1 | 4/2002 | Aga et al. | |
| 6,455,398 B1 * | 9/2002 | Fonstad, Jr. et al. | ......... 438/459 |
| 7,405,136 B2 | 7/2008 | Delprat et al. | |
| 2006/0166472 A1 * | 7/2006 | Henley et al. | ............... 438/548 |

FOREIGN PATENT DOCUMENTS

| | | |
|---|---|---|
| JP | 05-211128 | 8/1993 |
| JP | 11-074209 | 3/1999 |
| JP | 11-163363 | 6/1999 |
| JP | 2000-124092 | 4/2000 |
| JP | 2003-257804 | 9/2003 |
| JP | 2007-251129 | 9/2007 |

* cited by examiner

*Primary Examiner*—Walter L Lindsay, Jr.
*Assistant Examiner*—Reema Patel
(74) *Attorney, Agent, or Firm*—Eric J. Robinson; Robinson Intellectual Property Law Office, P.C.

(57) ABSTRACT

A second single crystal semiconductor film is formed over a first single crystal semiconductor film; a separation layer is formed by addition of ions into the second single crystal semiconductor film; a second insulating film functioning as a bonding layer is formed over the second single crystal semiconductor film; a surface of a first SOI substrate and a surface of a second substrate are made to face each other, so that a surface of the second insulating film and the surface of the second substrate are bonded to each other; and then heat treatment is performed to cause cleavage at the separation layer, so that a second SOI substrate in which a part of the second single crystal semiconductor film is provided over the second substrate with the second insulating film interposed therebetween is formed.

22 Claims, 16 Drawing Sheets
(1 of 16 Drawing Sheet(s) Filed in Color)

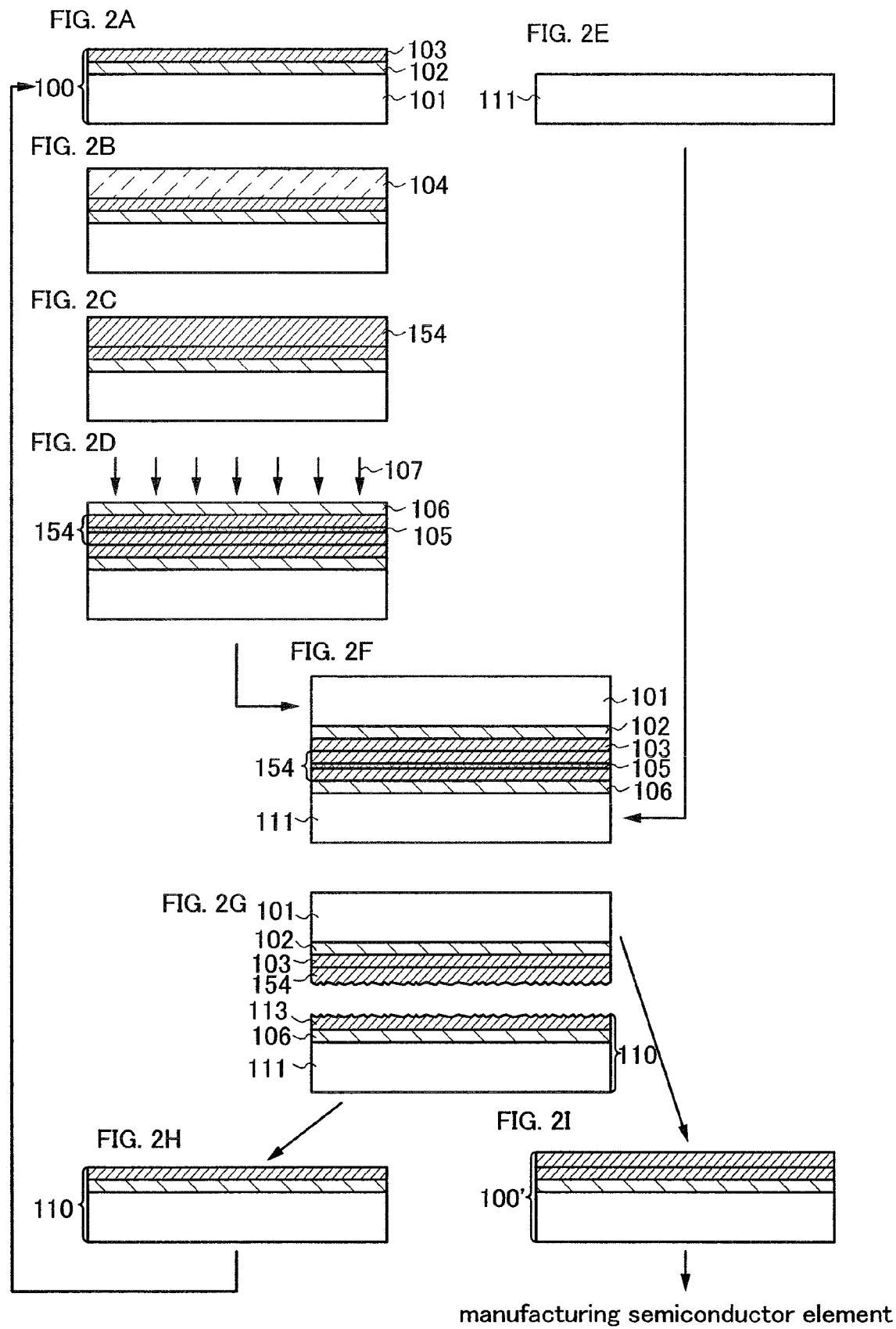

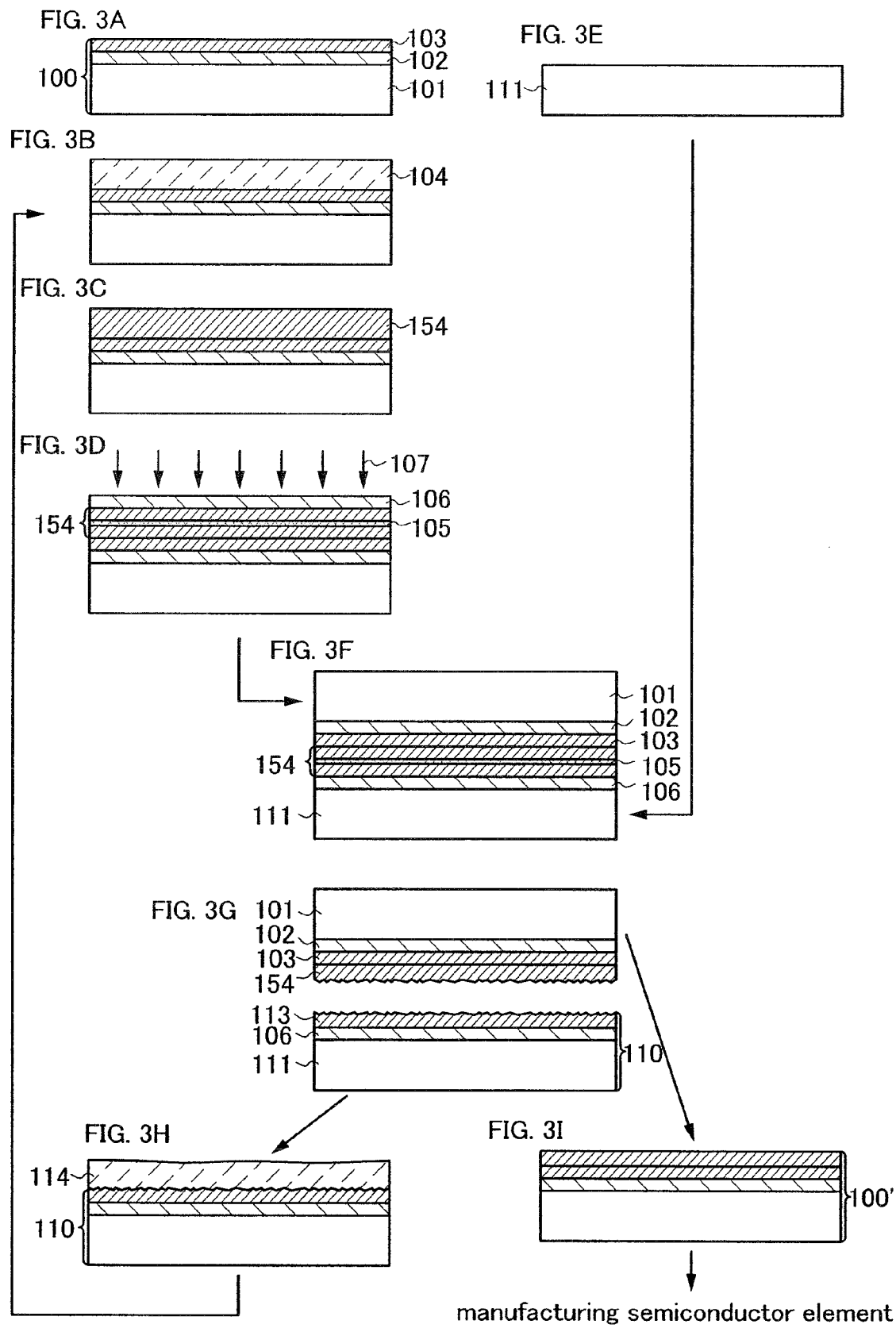

manufacturing semiconductor element

FIG. 13A bond, heat treatment
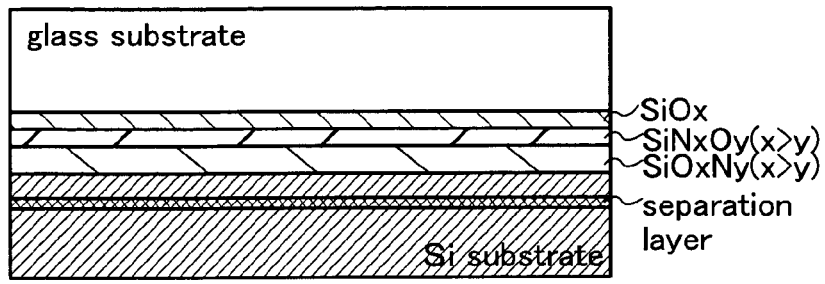
FIG. 13B separation
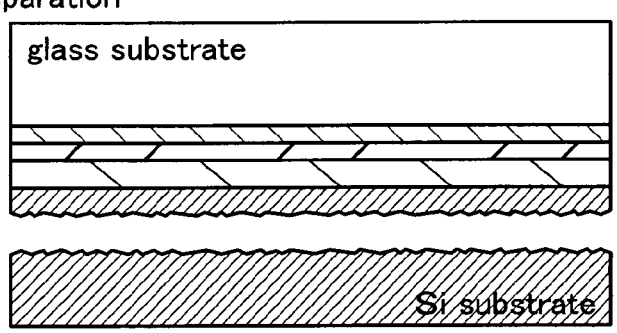
FIG. 13C
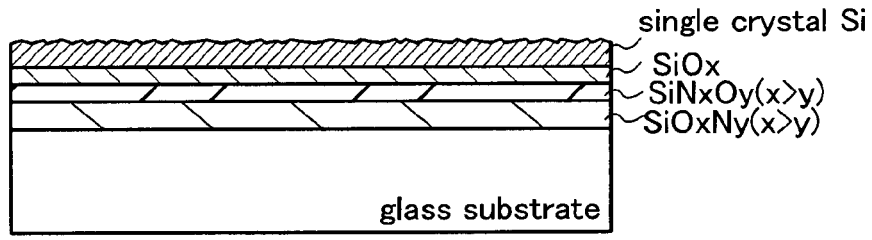
FIG. 13D forming a-Si
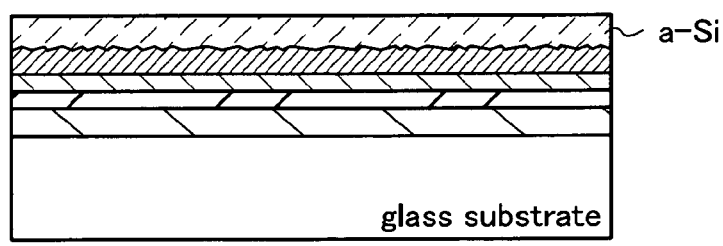
FIG. 13E heat treatment
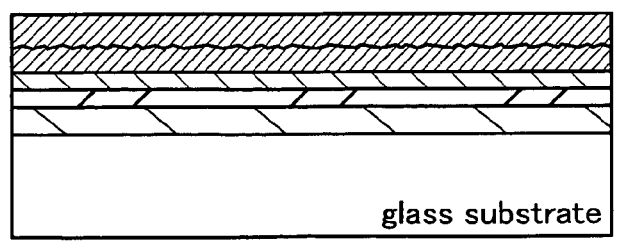

FIG. 15A before heat treatment
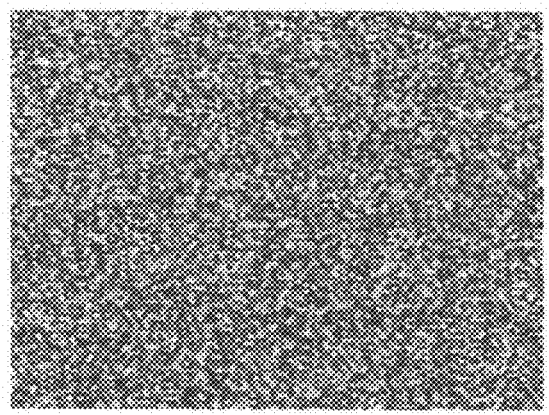
FIG. 15B after heat treatment
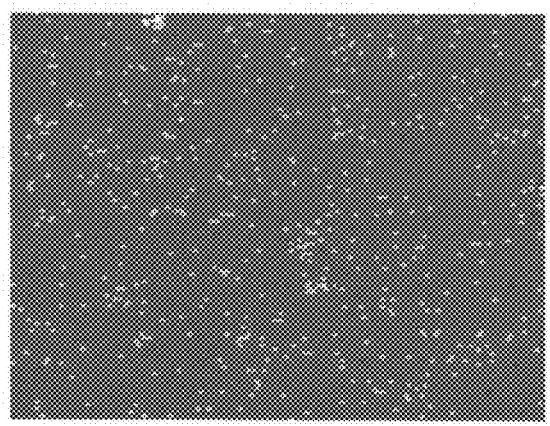
FIG. 15C
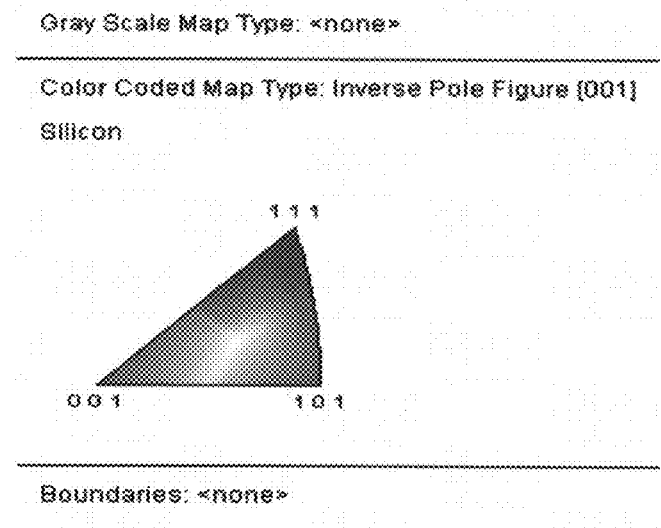

forming a –Si over surface of SOI after separation
→ and then heat treatment after separation

METHOD FOR MANUFACTURING SOI SUBSTRATE

BACKGROUND OF THE INVENTION

1. Field of the Invention

The present invention relates to a method for manufacturing an SOI (silicon on insulator) substrate and a method for manufacturing a semiconductor device.

2. Description of the Related Art

In recent years, integrated circuits using an SOI (silicon on insulator) substrate in which a thin single crystal semiconductor film is formed on its insulating surface, instead of a bulk silicon wafer, have been developed. Since parasitic capacitance between a drain of a transistor and a substrate is reduced with use of the SOI substrate, the SOI substrate has been attracted attention as a substrate which improves performance of semiconductor integrated circuits.

Smart Cut (registered trademark) method is known as one of methods for manufacturing an SOI substrate (for example, see Patent Document 1: Japanese Published Patent Application No. 2000-124092). An outline of a method for manufacturing an SOI substrate by Smart Cut (registered trademark) method is described below. First, by an ion implantation method, hydrogen ions are added into a silicon wafer which serves as a separation substrate to form an ion added layer at a predetermined depth from the surface. Then, the silicon wafer into which the hydrogen ions are added is bonded to another silicon wafer (a silicon wafer to be separated) with a silicon oxide film interposed therebetween. After that, by heat treatment, the ion added layer serves as a cleavage plane, and the separation silicon wafer into which the hydrogen ions have been added is separated as a thin film, whereby a single crystal silicon film can be formed over the silicon wafer to be separated to which the separation silicon wafer has been bonded. Smart Cut (registered trademark) method is also referred to as a "hydrogen ion implantation separation method".

A method in which a single crystal silicon layer is formed over a supporting substrate made of glass by such Smart Cut (registered trademark) method has been proposed (for example, see Patent Document 2: Japanese Published Patent Application No. H11-163363).

In addition, a method for reusing a silicon wafer which is a separation substrate by polishing of the silicon wafer after cleavage in Smart Cut (registered trademark) method has been proposed (for example, see Patent Document 3: Japanese Published Patent Application No. 2007-251129).

SUMMARY OF THE INVENTION

Since glass substrates can have a larger area and are less expensive than silicon wafers, the glass substrates are mainly used for manufacturing liquid crystal display devices and the like. With use of glass substrates as base substrates (substrates to be separated), inexpensive large-area SOI substrates can be manufactured. In this case, in order to form a single crystal semiconductor film over the glass substrate by Smart Cut (registered trademark) method, a silicon wafer which is a separation substrate needs to be separated so that part of the silicon wafer remains over the glass substrate after the silicon wafer and the glass substrate which is a substrate to be separated are bonded to each other.

However, when the characteristics (such as thermal expansion coefficient and the amount of bent) of the separation substrate and the substrate to be separated are different, defective bonding might be caused due to heat treatment or the like which is performed after bonding. In particular, when a substrate other than a semiconductor substrate (e.g., a glass substrate) is used as a substrate to be separated, materials of the substrates are different, and thus defective bonding is easily caused.

Moreover, when the same separation substrate is used repeatedly (reused), the quality of the separation substrate is reduced due to repeated heat treatment or the like, and thus the quality of an SOI substrate manufactured using the separation substrate might be reduced. Therefore, a significant difference might be caused between a first-manufactured SOI substrate and a last-manufactured SOI substrate, which are manufactured using one silicon wafer. Furthermore, when as many SOI substrates as possible are intended to be manufactured using one silicon wafer, the thickness of the substrate is reduced as the number of reuse is increased, and thus the separation substrate might be broken in a manufacturing process or the incidence rate of defective bonding might be increased.

In view of the above-described problems, it is an object of the present invention to reduce defective bonding when manufacturing an SOI substrate including a substrate formed of an insulator. It is another object of the present invention to suppress damage of a separation substrate and reduce quality differences between a plurality of SOI substrates when manufacturing the plurality of SOI substrates.

In the present invention, a second SOI substrate having a single crystal semiconductor film which is provided over a second substrate formed of the same material as a first substrate with an insulating film interposed therebetween is manufactured using a first SOI substrate having a single crystal semiconductor film provided over the first substrate with an insulating film interposed therebetween.

One feature of the present invention is a method for manufacturing an SOI substrate including the steps of preparing a first SOI substrate in which a first single crystal semiconductor film is provided over a first substrate formed of an insulator with a first insulating film interposed therebetween, and a second substrate formed of the same material as the first substrate; forming a second single crystal semiconductor film over the first single crystal semiconductor film; forming a separation layer by addition of ions into the second single crystal semiconductor film; forming a second insulating film over the second single crystal semiconductor film; making a surface of the first SOI substrate and a surface of the second substrate face each other, so that a surface of the second insulating film and the surface of the second substrate are bonded to each other; and performing heat treatment to cause cleavage at the separation layer, so that a second SOI substrate in which a part of the second single crystal semiconductor film is provided over the second substrate with the second insulating film interposed therebetween is formed.

Another feature of the present invention is a method for manufacturing an SOI substrate including the steps of: preparing a semiconductor substrate which has a first insulating film formed on its surface and in which a first separation layer is formed at a predetermined depth, a first substrate formed of an insulator, and a second substrate formed of the same material as the first substrate; making a surface of the semiconductor substrate and a surface of the first substrate face each other, so that a surface of the first insulating film and the surface of the first substrate are bonded to each other; performing heat treatment to cause cleavage at the first separation layer, so that a first SOI substrate in which a first single crystal semiconductor film is provided over the first substrate with the first insulating film interposed therebetween; forming a second single crystal semiconductor film over the first single crystal semiconductor film; forming a second separation layer by addition of ions into the second single crystal semiconductor film; forming a second insulating film over the second single crystal semiconductor film; making a surface of the first SOI substrate and a surface of the second substrate face each other, so that a surface of the second insulating film and the surface of the second substrate are bonded to each other; and performing heat treatment to cause cleavage at the second separation layer, so that a second SOI substrate in which a part of the second single crystal semiconductor film is formed over the second substrate with the second insulating film interposed therebetween.

Another feature of the present invention is a method for manufacturing an SOI substrate including a first process and a second process. The first process includes the steps of preparing a first SOI substrate in which a first single crystal semiconductor film is formed over a first substrate formed of an insulator with the first insulating film interposed therebetween, and a second substrate formed of the same material as the first substrate; forming a second single crystal semiconductor film over the first single crystal semiconductor film; forming a separation layer by addition of ions into the second single crystal semiconductor film; and forming a second insulating film over the second single crystal semiconductor film. The second process includes the steps of making a surface of the first SOI substrate and a surface of the second substrate face each other, so that a surface of the second insulating film and the surface of the second substrate are bonded to each other; and performing heat treatment to cause cleavage at the separation layer, so that a second SOI substrate in which a part of the second single crystal semiconductor film is provided over the second substrate with the second insulating film interposed therebetween. The second SOI substrate formed in the second process is used as the first SOI substrate in the first process.

Further, a "semiconductor device" in this specification refers to all devices which are capable of functioning by utilizing semiconductor characteristics, and electro-optical devices, semiconductor circuits, and electronic devices are all semiconductor devices.

Further, a "display device" in this specification includes a light-emitting device and a liquid crystal display device in its category. The light-emitting device includes a light-emitting element, and the liquid crystal display device includes a liquid crystal element. A light-emitting element includes, in its category, an element whose luminance is controlled by a current or a voltage, and specifically includes, in its category, an inorganic electroluminescence (EL) element, an organic EL element, and the like.

The present invention makes it possible to reduce defective bonding even when manufacturing an SOI substrate including a substrate formed of an insulator. Moreover, the present invention makes it possible to suppress damage of a separation substrate and reduce quality differences between a plurality of SOI substrates even when manufacturing the plurality of SOI substrates.

BRIEF DESCRIPTION OF THE DRAWINGS

The patent or application file contains at least one drawing executed in color. Copies of this patent or patent application publication with color drawings will be provided by the Office upon request and payment of the necessary fee.

In the accompanying drawings:

FIGS. 2A to 2I are views illustrating an example of a method for manufacturing an SOI substrate of the present invention;

FIGS. 3A to 3I are views illustrating an example of a method for manufacturing an SOI substrate of the present invention;

FIGS. 13A to 13E are views illustrating a method for manufacturing an SOI substrate of the present invention;

FIGS. 15A to 15C are views showing the results of EBSP of a semiconductor film before and after heat treatment.

DETAILED DESCRIPTION OF THE INVENTION

Figure 1A:
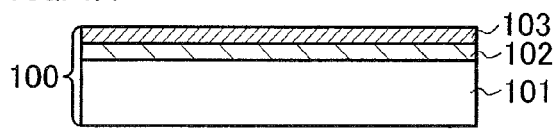
FIGS. 1A to 1I are views illustrating an example of a method for manufacturing an SOI substrate of the present invention.

Embodiment Modes and Embodiments of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes. In the structure of the present invention hereinafter described, reference numerals indicating the same portions are used in common in different drawings.

Embodiment Mode 1

In this embodiment mode, an example of a method for manufacturing an SOI substrate of the present invention will be described with reference to drawings.

First, a first SOI substrate 100 is prepared (see FIG. 1A).

In the first SOI substrate 100, a first single crystal semiconductor film 103 is provided over a first substrate 101 with an insulating film 102 interposed therebetween. Here, the first SOI substrate 100 serves as a separation substrate.

As the first substrate 101, a substrate formed of an insulator is used. Specifically, as the first substrate 101, a glass substrate used in the electronics industry, such as an aluminosilicate glass substrate, an aluminoborosilicate glass substrate, or a barium borosilicate glass substrate is used. Alternatively, a plastic substrate which has heat resistance against a processing temperature of this process and has an insulating film (e.g., a silicon oxide film or a silicon oxynitride film) on its surface can be used. With use of a glass substrate or a plastic substrate which can have a large area and is inexpensive as the first substrate 101, the cost can be reduced more than in the case of using a silicon wafer. That is, in this embodiment mode, a substrate other than a semiconductor substrate such as a silicon wafer (a non-semiconductor substrate) is used as the first substrate 101.

As the insulating film 102, a single layer of a silicon oxide film, a silicon oxynitride film, a silicon nitride film, a silicon nitride oxide film, or the like, or a stacked layer thereof can be used. Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The first single crystal semiconductor film 103 can be formed of a single crystal silicon film or the like. The thickness of the first single crystal semiconductor film 103 is preferably 20 nm to 250 nm. Note that the term "single crystal" in this specification refers to a crystal in which crystal faces and crystal axes are aligned and atoms or molecules which are included in the single crystal are aligned in a spatially ordered manner. However, although a single crystal is structured by orderly aligned atoms, a single crystal may include a lattice defect in which part of the alignment is disordered or a single crystal may include intended or unintended lattice distortion.

Figure 1E:
Figure 1B:
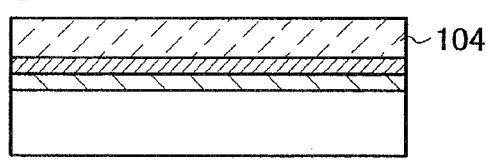

Next, a semiconductor film 104 is formed over the first single crystal semiconductor film 103 of the first SOI substrate 100 (see FIG. 1B).

As the semiconductor film 104, a silicon film can be formed to a thickness of 20 nm to 250 nm by a CVD method or the like. In this embodiment mode, an amorphous semiconductor film (e.g., an amorphous silicon film) is formed to a thickness of 20 nm to 250 nm over the first single crystal semiconductor film 103. The thickness of the semiconductor film 104 may be set as appropriate in accordance with the thickness of the first single crystal semiconductor film 103. For example, when the first single crystal semiconductor film 103 has a thickness which is needed in a separation step which is performed later, the semiconductor film 104 does not need to be provided.

Figure 1C:
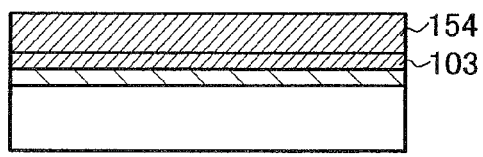

Next, heat treatment is performed to make the semiconductor film 104 formed over the first single crystal semiconductor film 103 be epitaxially grow (be solid phase grown) and crystallized (see FIG. 1C). Accordingly, a second single crystal semiconductor film 154 is formed over the first single crystal semiconductor film 103.

For the heat treatment, a heating furnace, laser irradiation, RTA (rapid thermal annealing), or a combination thereof can be used. Here, after the semiconductor film 104 is formed over the first single crystal semiconductor film 103, heat treatment is performed by RTA at 500° C. to 800° C. for 5 sec to 180 sec, whereby the semiconductor film 104 is crystallized.

Figure 1D:
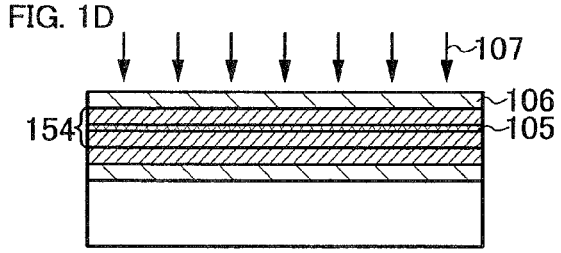

Next, a separation layer 105 is formed at a predetermined depth from a surface of the second single crystal semiconductor film 154, and an insulating film 106 is formed over the second single crystal semiconductor film 154 (see FIG. 1D).

The separation layer 105 can be formed in such a manner that the second single crystal semiconductor film 154 is irradiated with an ion beam 107 including ions accelerated by an electric field to add the ions into a region at the predetermined depth from the surface of the second single crystal semiconductor film 154. A source gas is excited to generate plasma of the source gas, and then ions included in the plasma are extracted by an effect of an electric field, whereby the ion beam 107 is generated.

The depth at which the separation layer 105 is formed can be adjusted by the accelerating energy of the ion beam 107 and the incidence angle thereof. The acceleration energy can be adjusted by an acceleration voltage, dose, or the like. The separation layer 105 is formed in a region at the same depth or almost the same depth as the average penetration depth of the ions. The thickness of a semiconductor film which is to be separated from the crystallized second single crystal semiconductor film 154 in a later step is determined depending on the depth at which ions are added. The depth at which the separation layer 105 is formed is greater than or equal to 10 nm and less than or equal to 500 nm, preferably, greater than or equal to 50 nm and less than or equal to 200 nm.

In order to add ions, an ion doping method without mass separation being performed or an ion implantation method with mass separation being performed can be used.

As a source gas which is used for adding ions, a hydrogen gas, a rare gas, and the like are given. In this embodiment mode, a hydrogen gas is preferably used. When a hydrogen gas is used in an ion doping method, ion species which are generated are $H^+$, $H_2^+$, and $H_3^+$, and it is preferable that the number of $H_3^+$ which are added be the largest. The addition efficiency of $H_3^+$ ions is better than that of $H^+$ ions and $H_2^+$ ions; thus, reduction in addition time can be achieved. Moreover, a crack is easily generated in the separation layer in a later step.

It is preferable that an insulating film be provided over the second single crystal semiconductor film 154 before ions are added. The provision of the insulating film makes it possible to prevent an impurity from attaching to the surface of the second single crystal semiconductor film 154 or prevent the surface from being etched by addition of ions. As the insulating film, a single layer of a silicon oxide film, a silicon oxynitride film, a silicon nitride film, a silicon nitride oxide film, or the like, or a stacked layer thereof can be used. In this case, such an insulating film is formed under the insulating film 106. Alternatively, ions may be added after the insulating film 106 is formed.

The insulating film 106 functions as a layer which is bonded to a substrate to be separated (a bonding layer) and can be a silicon oxide film or a silicon oxynitride film formed by a CVD method, a sputtering method, or the like. In addition, since the insulating film 106 functions as a bonding layer, its surface is preferably flat. Here, a silicon oxide layer which is deposited by a CVD method using organosilane as a source gas is used. Alternatively, a silicon oxide layer or a silicon oxynitride layer which is deposited by a CVD method using silane as a source gas can be used.

Note that, although the case where the separation layer 105 is provided in the second single crystal semiconductor film 154 is described in this embodiment mode, the separation layer 105 may be provided in the first single crystal semiconductor film 103 in the case where the first single crystal semiconductor film 103 is thicker than the second single crystal semiconductor film 154.

Next, a second substrate 111 is prepared (see FIG. 1E).

As the second substrate 111, a substrate formed of the same material as the first substrate 101 included in the first SOI substrate 100 which is a separation substrate is used. For example, a glass substrate can be used as the first substrate 101 and the second substrate 111. In addition, here, the second substrate 111 serves as a substrate to be separated.

The use of a substrate formed of the same material as the first substrate 101 as the second substrate 111 makes it possible to reduce the difference in thermal expansion between the substrates and the difference between the difference in contraction of one substrate between before and after heat treatment and the difference in contraction of the other substrate between before and after heat treatment, even when the heat treatment is performed after the first SOI substrate 100 and the second substrate 111 are bonded to each other. Accordingly, defective bonding can be suppressed.

Figure 1F:
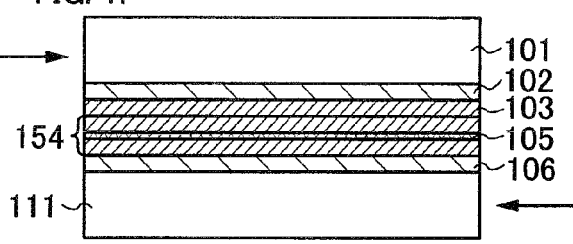

Next, a surface of the first SOI substrate 100 and a surface of the second substrate 111 are made to face each other, so that a surface of the insulating film 106 which functions as a bonding layer and the surface of the second substrate 111 are bonded to each other (see FIG. 1F). This bond is formed under the action of a van der Waals force, and by placement of the first SOI substrate 100 and the second substrate 111 in close contact, strong bond can be formed by hydrogen bonding using Si—H, Si—OH, and the like.

Note that it is preferable that a bonding plane be cleaned by megasonic cleaning, or by megasonic cleaning and cleaning with ozone water before the first SOI substrate 100 and the second substrate 111 are bonded to each other. With such treatment, an organic substance and the like on the bonding plane can be removed and the surfaces can be made hydrophilic.

Figure 1G:
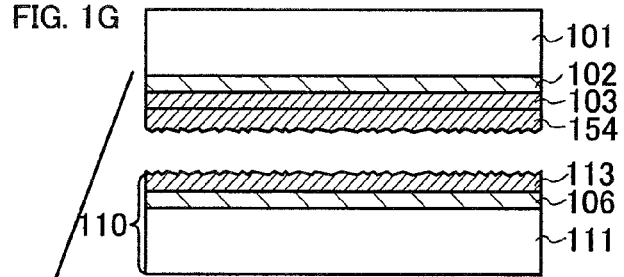

Next, heat treatment is performed to cause separation (cleavage) at the separation layer 105, so that a third single crystal semiconductor film 113 (a part of the second single crystal semiconductor film 154) is provided over the second substrate 111 with the insulating film 106 interposed therebetween (see FIG. 1G). Here, by heat treatment at 400° C. to 700° C., a change in the volume of microvoids of ions (e.g., hydrogen ions) included in the separation layer 105 occurs, which enables cleavage to occur along the separation layer 105. Accordingly, the third single crystal semiconductor film 113 is formed over the second substrate 111 with the insulating film 106 interposed therebetween, while the second single crystal semiconductor film 154 which has not been separated remains over the first substrate 101.

Through the above-described steps, a second SOI substrate 110 can be formed in which the third single crystal semiconductor film 113 is formed over the second substrate 111 with the insulating film 106 interposed therebetween. The second SOI substrate 110 can be used as the separation substrate as in FIG. 1A.

As described above, the SOI substrate is used as a separation substrate and the substrate formed of the same material as the substrate included in the SOI substrate which is the separation substrate is used as a substrate to be separated, so that defective bonding can be reduced even when the SOI substrate including a substrate other than a semiconductor substrate is manufactured. Moreover, the second SOI substrate 110 formed using the second substrate 111 which is a substrate to be separated is used as a separation substrate, so that throughput can be increased in a mass production process of a plurality of SOI substrates.

Figure 1H:
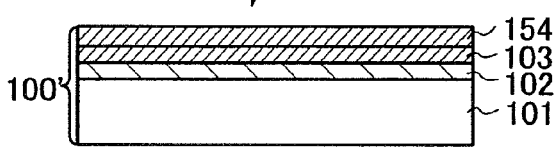
Figure 1I:
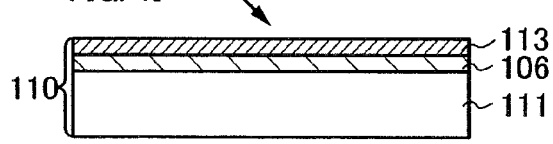

In the above-described step, planarization treatment may be performed on the surface of a first SOI substrate 100' and the second SOI substrate 110 after separation (see FIGS. 1H and 1I). By the planarization treatment, the surface of the second single crystal semiconductor film 154 and the surface of the third single crystal semiconductor film 113 can be planarized even when unevenness occurs on the surfaces.

For the planarization treatment, CMP (chemical mechanical polishing), etching treatment, laser light irradiation, or the like can be performed. Here, the single crystal semiconductor film is recrystallized and the surface thereof is planarized by laser light irradiation which is performed after etching treatment (etch-back treatment) of either dry etching or wet etching, or a combination thereof. Further, in the planarization treatment of the first SOI substrate 100, the second single crystal semiconductor film 154 may be removed to expose the first single crystal semiconductor film 103.

By irradiation with laser light from above the top surface of the single crystal semiconductor film, the top surface of the single crystal semiconductor film can be melted. After being melted, the single crystal semiconductor film is cooled and solidified to obtain a single crystal semiconductor film having the top surface whose planarity is improved. With use of laser light, the first substrate 101 or the second substrate 111 is not directly heated; thus, increase in the temperature of the first substrate 101 or the second substrate 111 can be suppressed. Thus, a low-heat-resistant substrate such as a glass substrate can be used as the first substrate 101 or the second substrate 111.

Note that it is preferable that the single crystal semiconductor film be partially melted by the laser light irradiation. This is because, if the single crystal semiconductor film is completely melted, it is microcrystallized due to disordered nucleation after being in a liquid phase, so that crystallinity of the single crystal semiconductor film is highly likely to decrease. On the other hand, by partial melting, crystal growth proceeds from a solid-phase part, which is not melted. Accordingly, defects in the semiconductor film can be reduced. Note that "complete melting" here refers to that the single crystal semiconductor film is melted up to the vicinity of the lower interface of the single crystal semiconductor film to be made in a liquid state. On the other hand, "partial melting" in this case refers to that the upper part of the single crystal semiconductor film is melted to be made in a liquid phase whereas the lower part thereof is kept in a solid phase without being melted.

A pulsed laser is preferably used for the above-described laser light irradiation because pulsed laser light with high energy can be emitted instantaneously and the partially melted state can be easily generated. The repetition rate is preferably about greater than or equal to 1 Hz and less than or equal to 10 MHz.

After the above-described laser light irradiation, a step of reducing the thickness of the single crystal semiconductor film may be performed. For the reduction of the thickness of the single crystal semiconductor film, etching treatment (etch-back treatment) of either dry etching or wet etching, or a combination thereof may be employed. For example, when the single crystal semiconductor film is formed of a silicon material, the thickness thereof can be reduced by dry etching using $SF_6$ and $O_2$ as a process gas.

Note that the method for manufacturing an SOI substrate described in this embodiment mode can be combined with manufacturing methods in other embodiment modes in this specification, as appropriate.

Embodiment Mode 2

In this embodiment mode, a method for manufacturing a plurality of SOI substrates and usage of the substrate will be described with reference to drawings.

First, the first SOI substrate 100 which serves as a separation substrate and the second substrate 111 are prepared, and after the second single crystal semiconductor film 154 is formed over the first SOI substrate 100, the separation layer 105 is formed in the second single crystal semiconductor film 154, and the insulating film 106 is formed over the second single crystal semiconductor film 154 (see FIGS. 2A to 2E, hereinafter denoted by "Process A"). Note that the steps of FIGS. 2A to 2E may be performed similarly to the above-described steps of FIGS. 1A to 1E.

Next, after a surface of the insulating film 106 which serves as a bonding layer and a surface of the second substrate 111 are bonded to each other, heat treatment is performed, and thus cleavage occurs at the separation layer 105, so that the third single crystal semiconductor film 113 is formed over the second substrate 111 with the insulating film 106 interposed therebetween, and then planarization treatment is performed on the surfaces of the first SOI substrate 100' and the second SOI substrate 110 after the separation (see FIGS. 2F to 2I, hereinafter denoted by "Process B"). Note that the steps of FIGS. 2F to 2I may be performed similarly to the above-described steps illustrated in FIGS. 1F to 1I.

After that, a new SOI substrate is manufactured using the second SOI substrate 110 formed in Process B as the first SOI substrate 100 for separation in Process A. In addition, in Process B, a semiconductor element such as a transistor is manufactured using the first SOI substrate 100' after the separation. In that case, the second substrate 111, the insulating film 106, and the third single crystal semiconductor film 113 of the second SOI substrate 110 formed in Process B correspond to the first substrate 101, the insulating film 102, and the first single crystal semiconductor film 103 of the first SOI substrate 100 in Process A, respectively. Note that, when the surfaces of the first SOI substrate 100' and the second SOI substrate 110 after the separation are flat in Process B, the planarization treatment (FIGS. 2H and 2I) may be omitted.

That is, in this embodiment mode, an SOI substrate which is anew manufactured using the SOI substrate for separation is once used as an SOI substrate for separation, and the SOI substrate used as the SOI substrate for separation is used as an SOI substrate for manufacturing a semiconductor element such as a transistor.

By manufacture of an SOI substrate by the method illustrated in FIGS. 2A to 2I, a separation substrate does not need to be reused over and over again. Accordingly, decline in the quality of the separation substrate due to repeated heat treatment or the like which is performed on the separation substrate can be suppressed. In addition, damage of the separation substrate due to reduction in thickness or the like can be prevented. Moreover, after the anew-manufactured SOI substrate is used as the substrate for manufacturing a semiconductor element after once being used as the separation substrate, so that quality differences between a plurality of SOI substrates can be reduced when manufacturing the plurality of SOI substrates.

In particular, when a glass substrate with low heat resistance is used as the separation substrate, defective bonding might occur due to change in the characteristics of the substrate due to heat treatment performed several times due to repeated use of the separation substrate. However, defective bonding with change in the characteristics of the substrate can be reduced as long as the heat treatment is performed only several times (preferably once).

The method in which the semiconductor film is formed over the third single crystal semiconductor film 113 after planarization of the third single crystal semiconductor film 113 and crystallization is performed by epitaxial growth (solid-phase growth) by heat treatment in the case where the anew-manufactured SOI substrate (the second SOI substrate 110) is used as the separation substrate (the first SOI substrate 100 in Process A) is illustrated in FIGS. 2A to 2I. However, the present invention is not limited thereto.

For example, a semiconductor film 114 is formed without performing planarization treatment on the surface of the third single crystal semiconductor film 113 of the second SOI substrate 110 after the separation (see FIG. 3H), and then the semiconductor film 114 may be crystallized by heat treatment (see FIG. 3C)). In that case, even in the case where the surface of the third single crystal semiconductor film 113 has unevenness, when the semiconductor film 114 is formed over the third single crystal semiconductor film 113, and then crystallization is performed to form the second single crystal semiconductor film 154, the surface of the second single crystal semiconductor film 154 can have unevenness suppressed more than the unevenness of the surface of the third single crystal semiconductor film 113.

After that, a step of FIG. 3D may be performed or the step of FIG. 3D may performed after planarization treatment is performed on the surface of the second single crystal semiconductor film 154. Note that, even when the second single crystal semiconductor film 154 is planarized, the surface of the second single crystal semiconductor film 154 is flatter than the surface of the third single crystal semiconductor film 113 after the separation, and thus planarization can be performed more easily than in the case of performing planarization after the separation.

The case where, after the separation, the planarization treatment (FIG. 3I) is performed on the first SOI substrate 100 which is used as the separation substrate for manufacturing the second SOI substrate 110 is described. Alternatively, in a similar manner to the manufacture of the second SOI substrate 110, heat treatment may be performed after the semiconductor film is formed over the remaining second single crystal semiconductor film 154 to form the single crystal semiconductor film, using the remaining second single crystal semiconductor film 154 as a seed layer. This is preferable when the single crystal semiconductor film of the SOI substrate needs to be thick.

Note that the method for manufacturing an SOI substrate described in this embodiment mode can be combined with manufacturing methods in other embodiment modes in this specification, as appropriate.

Embodiment Mode 3

In this embodiment mode, a method for manufacturing an SOI substrate which is different from that described in the above embodiment modes will be described with reference to drawings. Specifically, a method which is different from that in the above embodiment modes will be described as for a method in which a semiconductor film is formed over a first single crystal semiconductor film and the semiconductor film is epitaxially grown (gas phase grown) at the same time as its deposition to form a second single crystal semiconductor film.

By formation of a semiconductor film (e.g., a silicon film) over a single crystal semiconductor film (e.g., a single crystal silicon film) by a CVD method under predetermined conditions, the semiconductor film to be formed can be epitaxially grown (gas phase grown) using the single crystal silicon film as a seed layer at the same time as its deposition.

Figure 4A:
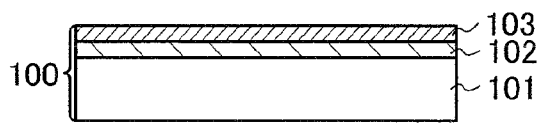
FIGS. 4A to 4I are views illustrating an example of a method for manufacturing an SOI substrate of the present invention.
Figure 4B:
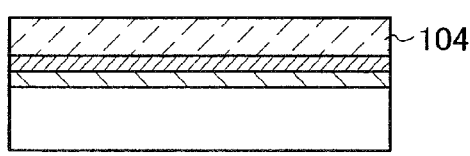
Figure 4C:
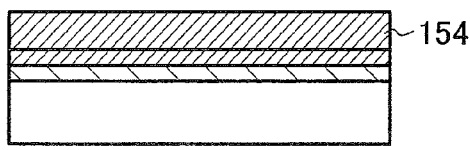
Figure 4D:
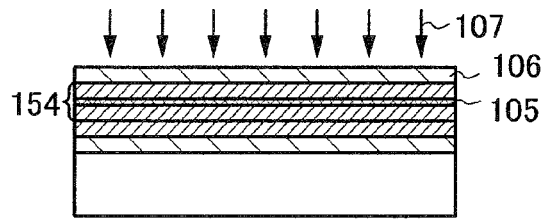
Figure 4E:
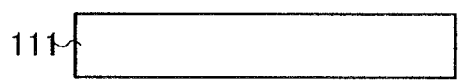
Figure 4F:
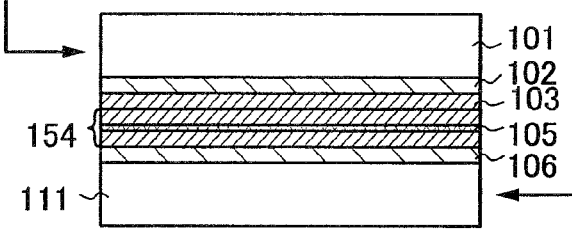
Figure 4G:
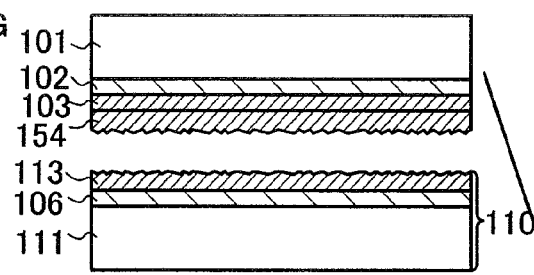
Figure 4H:
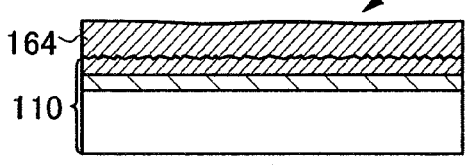
Figure 4I:
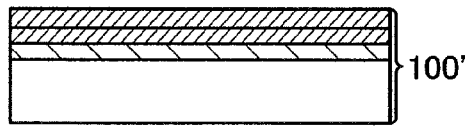

For example, after the above-described steps of FIGS. 2A to 2G are performed, a semiconductor film is formed over the second SOI substrate 110 which is to be used as a separation substrate by a CVD method under predetermined conditions. Thus, the semiconductor film is formed over the third single crystal semiconductor film 113 of the second SOI substrate 110 while the semiconductor film is epitaxially grown (gas phase grown), so that a fourth single crystal semiconductor film 164 can be formed (see FIG. 4H).

Note that a plasma CVD method is performed under the same conditions as those for forming a microcrystal semiconductor film. Specifically, a plasma CVD method is performed under such conditions where the flow rate of a hydrogen gas is 50 times or more, preferably 100 times or more, as large as that of a silane gas under an atmosphere containing the silane gas and the hydrogen gas. By a plasma CVD method performed under such conditions, the semiconductor film can be epitaxially grown at the same time as its deposition.

Note that the method for manufacturing an SOI substrate described in this embodiment mode can be combined with manufacturing methods in other embodiment modes in this specification, as appropriate.

Embodiment Mode 4

In this embodiment mode, an example of a method for manufacturing an SOT substrate which serves as a separation substrate in the method for manufacturing an SOI substrate described in the above embodiment modes will be described with reference to drawings.

Although the case where the SOI substrate (the second SOI substrate 110) which is manufactured using the SOI substrate (the first SOI substrate 100) which functions as a separation substrate is used as a separation substrate is described in the above embodiment modes, a method for manufacturing the SOI substrate (the first SOI substrate 100) which is base of the manufacture will be described with reference to drawings in this embodiment mode.

Figure 9A:
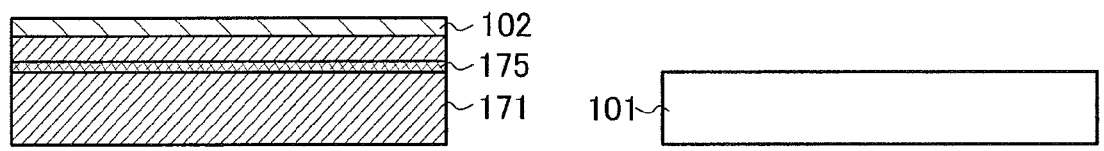
FIGS. 9A to 9F are views illustrating an example of a method for manufacturing an SOI substrate which serves as a separation substrate.

First, a single crystal semiconductor substrate 171 (e.g., a single crystal silicon substrate) which has the insulating film 102 on its surface and a separation layer 175 at a predetermined depth from its surface is prepared (see FIG. 9A).

As the single crystal semiconductor substrate 171, a commercial semiconductor substrate can be used. For example, a single crystal silicon substrate, a single crystal germanium substrate, and a compound semiconductor substrate of gallium arsenide, indium phosphide, or the like can be used. Typically, sizes of the commercial silicon substrates are 5 inches (125 mm), 6 inches (150 mm), 8 inches (200 mm), and 12 inches (300 mm) in diameter and shapes of the commercial silicon substrates are circular. Note that the shape is not limited to the circular shape, and a silicon substrate which is processed into a rectangular shape or the like can be used.

The insulating film 102 functions as a bonding layer.

The separation layer 175 can be formed in such a manner that the single crystal semiconductor substrate 171 is irradiated with an ion beam including ions accelerated by an electric field to introduce the ions at a predetermined depth from a surface of the single crystal semiconductor substrate 171.

Figure 9B:
Figure 9C:
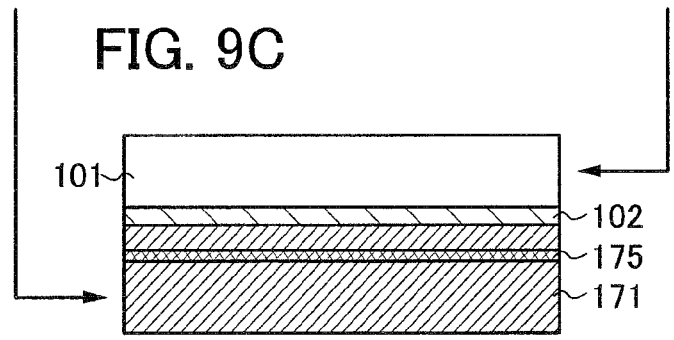

Next, the first substrate 101 is prepared (see FIG. 9B), the surface of the single crystal semiconductor substrate 171 and a surface of the first substrate 101 are made to face each other, so that a surface of the insulating film 102 which functions as a bonding layer and the surface of the first substrate 101 are bonded to each other (see FIG. 9C). The surface of the insulating film 102 formed over the single crystal semiconductor substrate 171 and the surface of the first substrate 101 are placed in close contact, so that the bond is formed. This bond is formed under the action of a van der Waals force, and by placement of the first SOI substrate 100 and the second substrate 111 in close contact, strong bond can be formed by hydrogen bonding using Si—H, Si—OH, and the like.

Figure 9D:
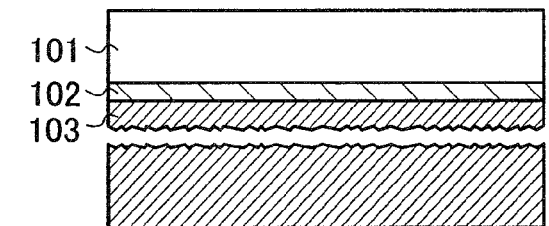
Figure 9E:
Figure 9F:
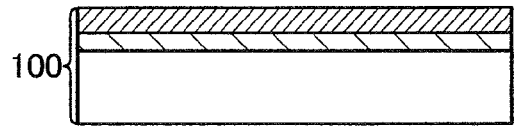

Next, heat treatment is performed to cause cleavage at the separation layer 175, so that a part of the single crystal semiconductor substrate 171 is separated to be formed over the first substrate 101 (see FIG. 9D). Here, by heat treatment at 400° C. to 700° C., a change in the volume of microvoids of ions (e.g., hydrogen ions) included in the separation layer 175 occurs, which enables cleavage to occur along the separation layer 175. Accordingly, the first single crystal semiconductor film 103 is formed over the first substrate 101 with the insulating film 102 interposed therebetween.

Through the above-described steps, the first SOI substrate 100 can be formed in which the first single crystal semiconductor film 103 is formed over the first substrate 101 with the insulating film 102 interposed therebetween.

After that, the first SOI substrate 100 can be used as the separation substrate in FIGS. 1A to 1I and FIGS. 2A to 2I.

As described above, in this embodiment mode, the SOI substrate which is to be used as the separation substrate later is manufactured using the single crystal semiconductor substrate, and then the SOI substrate is used as the separation substrate. In a conventional method, if 50 SOI substrates each including a single crystal semiconductor film are formed over a non-semiconductor substrate (e.g., a glass substrate), a single crystal semiconductor substrate needs to be used as a separation substrate for manufacturing all the SOI substrates. Thus, defective bonding is highly likely to occur due to the difference in the characteristics between the separation substrate and a substrate to be separated and yield might be reduced. In addition, when the semiconductor substrate is used repeatedly, quality differences between a plurality of manufactured SOI substrates occur with decline of the quality of the semiconductor substrate which serves as a separation substrate.

On the other hand, in the method for manufacturing an SOI substrate of the present invention, although the single crystal semiconductor substrate is used as the separation substrate for manufacturing the first SOI substrate, the substrate formed of the same material as the separation substrate can be used as the substrate to be separated for manufacturing the SOI substrate second time and each time thereafter. Accordingly, defective bonding can be reduced and increase in the yield can be achieved. Moreover, with use of the SOI substrate manufactured as illustrated in FIGS. 2A to 2I as the separation substrate, the separation substrate can be prevented from being reused repeatedly and quality differences between a plurality of manufactured SOI substrates can be reduced.

Note that the method for manufacturing an SOI substrate described in this embodiment mode can be combined with manufacturing methods in other embodiment modes in this specification, as appropriate.

Embodiment Mode 5

In this embodiment mode, a method for manufacturing a semiconductor device with use of the SOI substrate which is manufactured according to the above embodiment modes will be described.

First, a method for manufacturing an n-channel thin film transistor and a p-channel thin film transistor will be described as a method for manufacturing a semiconductor device with reference to FIGS. 5A to 5D and FIGS. 6A to 6C. By combination of a plurality of thin film transistors (TFTs), various semiconductor devices can be manufactured.

A case where the SOI substrate which is manufactured according to the method of Embodiment Mode 1 is used as an SOI substrate will be described. Note that, here, a case will be described where an SOI substrate formed in such a manner that planarization treatment is performed and the second single crystal semiconductor film 154 is removed to expose the first single crystal semiconductor film 103 in the step of FIG. 1H is used.

Figure 5A:
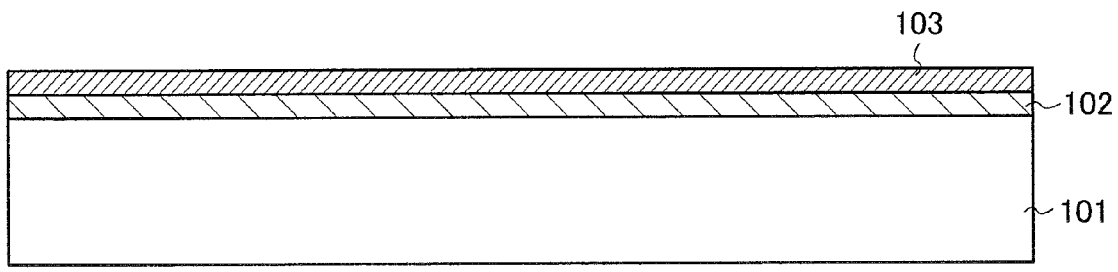
FIGS. 5A to 5D are views illustrating an example of a method for manufacturing a semiconductor device using an SOI substrate of the present invention.

FIG. 5A is a cross-sectional view of the SOI substrate which is manufactured according to the method described with reference to FIGS. 1A to 1I.

Figure 5B:
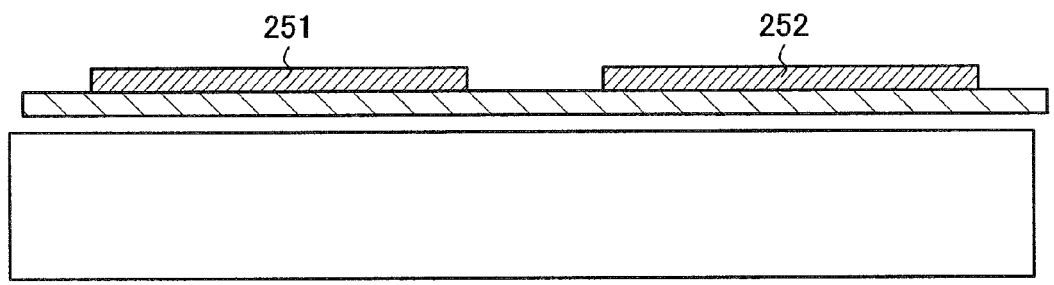

The first single crystal semiconductor film 103 of the SOI substrate is separated for each element by etching to form semiconductor films 251 and 252 as illustrated in FIG. 5B. The semiconductor film 251 is included in an n-channel TFT, and the semiconductor film 252 is included in a p-channel TFT.

Figure 5C:
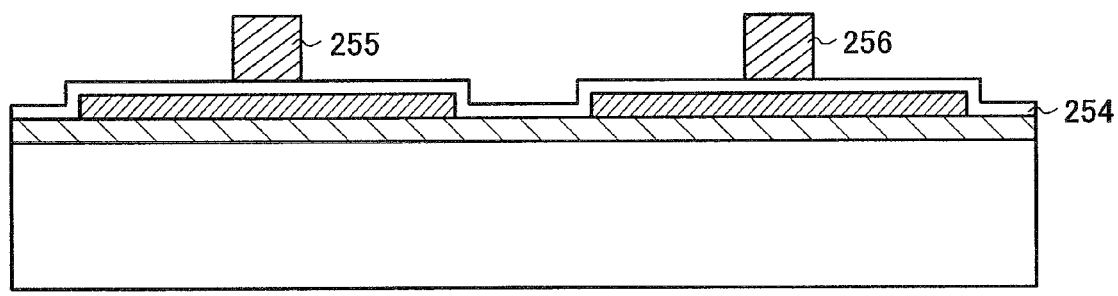

As illustrated in FIG. 5C, an insulating film 254 is formed over the semiconductor films 251 and 252. Then, a gate electrode 255 is formed over the semiconductor film 251 with the insulating film 254 interposed therebetween, and a gate electrode 256 is formed over the semiconductor film 252 with the insulating film 254 interposed therebetween.

Before the first single crystal semiconductor film 103 is etched, it is preferable to add an impurity element which serves as an acceptor, such as boron, aluminum, or gallium, or an impurity element which serves as a donor, such as phosphorus or arsenic, into the first single crystal semiconductor film 103 in order to control the threshold voltage of the TFTs. For example, an acceptor is added into a region where the n-channel TFT is formed, and a donor is added into a region where the p-channel TFT is formed.

Figure 5D:
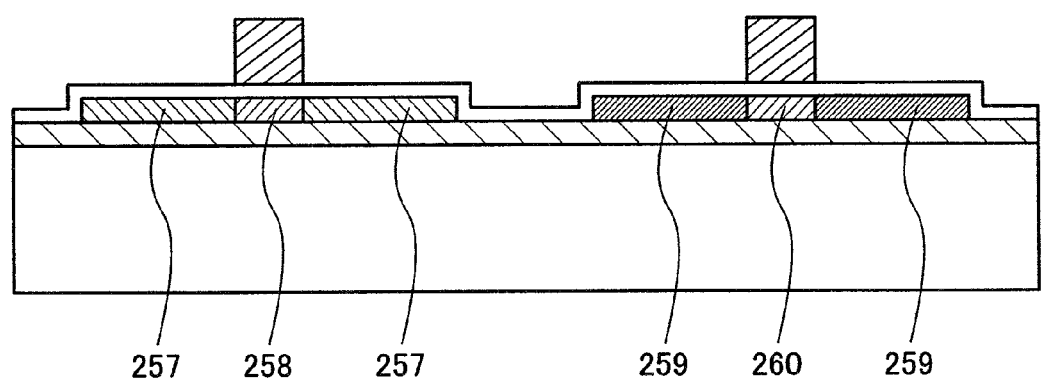

Next, as illustrated in FIG. 5D, n-type low-concentration impurity regions 257 are formed in the semiconductor film 251, and p-type high-concentration impurity regions 259 are formed in the semiconductor film 252. First, the n-type low-concentration impurity regions 257 are formed in the semiconductor film 251. In order to form the n-type low-concentration impurity regions 257, the semiconductor film 252 where the p-channel TFT is formed is covered with a resist mask, and a donor is added into the semiconductor film 251. As the donor, phosphorus or arsenic may be added. When the donor is added by an ion doping method or an ion implantation method, the gate electrode 255 serves as a mask, and the n-type low-concentration impurity regions 257 are formed in the semiconductor film 251 in a self-aligned manner. A region of the semiconductor film 251 which overlaps with the gate electrode 255 serves as a channel formation region 258.

Next, after the mask which covers the semiconductor film 252 is removed, the semiconductor film 251 where the n-channel TFT is formed is covered with a resist mask. Then, an acceptor is added into the semiconductor film 252 by an ion doping method or an ion implantation method. Boron can be added as the acceptor. At the step of adding the acceptor, the gate electrode 255 serves as a mask and the p-type high-concentration impurity regions 259 are formed in the semiconductor film 252 in a self-aligned manner. The p-type high-concentration impurity regions 259 serve as a source region and a drain region. A region of the semiconductor film 252 which overlaps with the gate electrode 256 serves as a channel formation region 260. Here, the method in which the p-type high-concentration impurity regions 259 are formed after the n-type low-concentration impurity regions 257 are formed is described; however, the p-type high-concentration impurity regions 259 can be formed first.

Figure 6A:
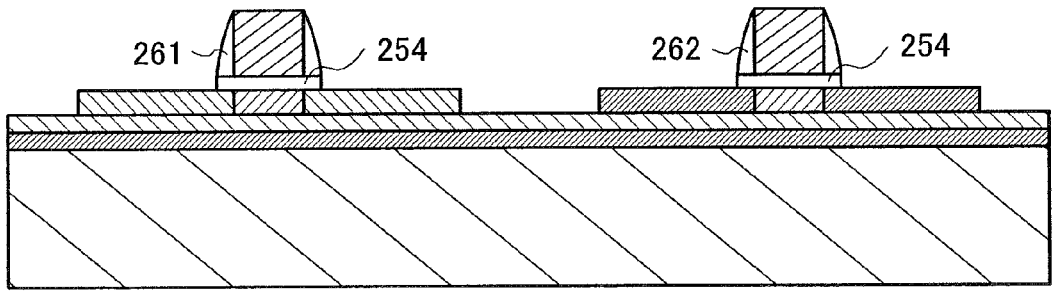
FIGS. 6A to 6C are views illustrating an example of a method for manufacturing a semiconductor device using an SOI substrate of the present invention.

Next, after the resist which covers the semiconductor film 251 is removed, an insulating film having a single layer structure of a nitrogen compound such as silicon nitride or an oxide such as silicon oxide or a stacked layer structure thereof is formed by a plasma CVD method or the like. This insulating film is anisotropically etched in a perpendicular direction to form sidewall insulating films 261 and 262 which are in contact with side surfaces of the gate electrodes 255 and 256, respectively as illustrated in FIG. 6A. By this anisotropic etching, the insulating film 254 is also etched.

Figure 6B:
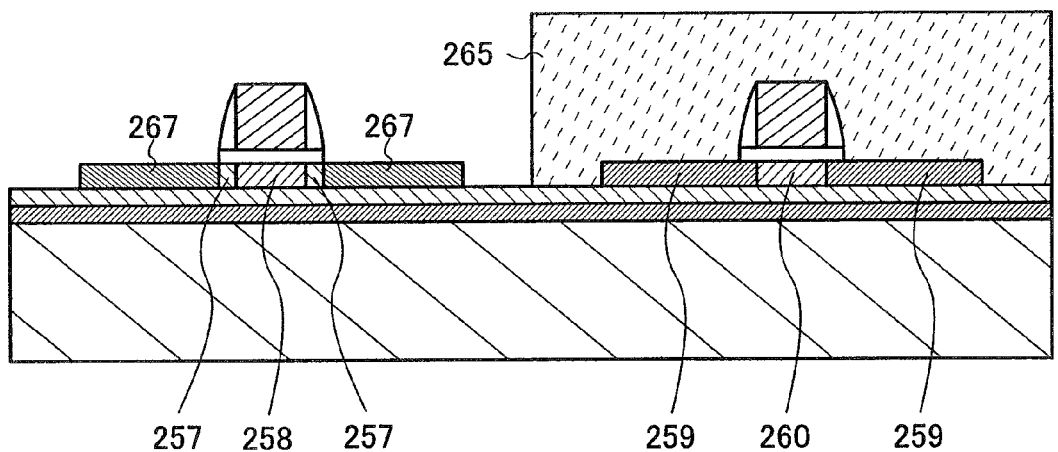

Next, as illustrated in FIG. 6B, the semiconductor film 252 is covered with a resist 265. In order to form high-concentration impurity regions serving as a source region and a drain region in the semiconductor film 251, donors are added into the semiconductor film 251 at high dose by an ion implantation method or an ion doping method. The gate electrode 255 and the sidewall insulating film 261 serve as masks, and n-type high-concentration impurity regions 267 are formed. Then, heat treatment for activating the donors and the acceptors is performed.

Figure 6C:
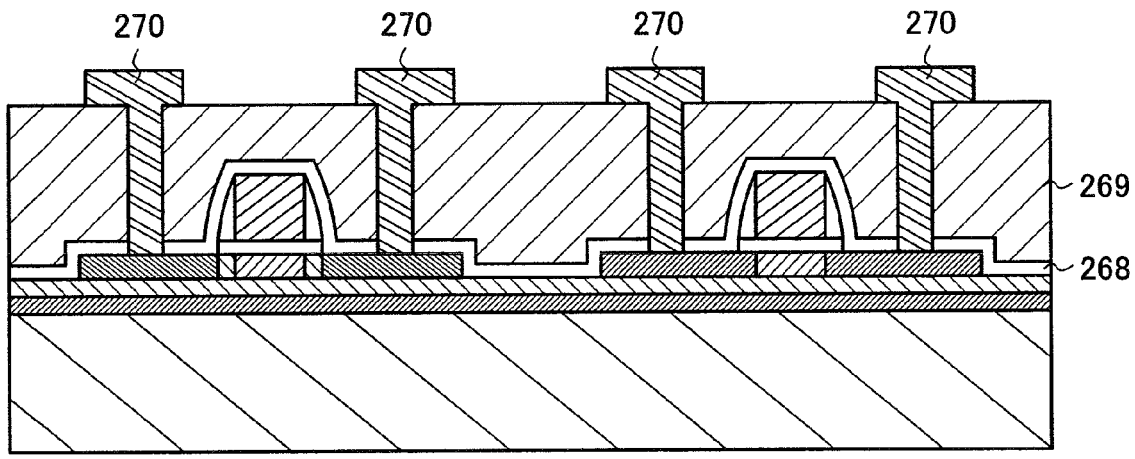

After the heat treatment for activation, an insulating film 268 containing hydrogen is formed as illustrated in FIG. 6C. After the insulating film 268 is formed, heat treatment is performed at a temperature of greater than or equal to 350° C. and less than or equal to 450° C., hydrogen contained in the insulating film 268 is diffused into the semiconductor films 251 and 252. The insulating film 268 can be formed by deposition of silicon nitride or silicon nitride oxide by a plasma CVD method at a process temperature of less than or equal to 350° C. The supply of hydrogen to the semiconductor films 251 and 252 makes it possible to efficiently compensate defects which are to be trapping centers in the semiconductor films 251 and 252 and at an interface with the insulating film 254.

After that, an interlayer insulating film 269 is formed. The interlayer insulating film 269 can be formed of a film having a single layer structure or a stacked layer structure of any one or more of films selected from an insulating film containing an inorganic material, such as a silicon oxide film or a BPSG (borophosphosilicate glass) film, and an organic resin film containing polyimide, acrylic, or the like. After contact holes are formed in the interlayer insulating film 269, wirings 270 are formed as illustrated in FIG. 6C. The wirings 270 can be formed of a conductive film having a three-layer structure in which a low-resistance metal film such as an aluminum film or an aluminum-alloy film is sandwiched between barrier metal films. The barrier metal films can be formed of metal films containing molybdenum, chromium, titanium, or the like.

Through the above-described steps, a semiconductor device having the n-channel TFT and the p-channel TFT can be manufactured. Since the concentration of the metal element contained in the semiconductor film in which the channel formation region is formed is reduced in the manufacturing process of the SOI substrate, a TFT in which off current is small and variation of the threshold voltage is suppressed can be manufactured.

Although the method for manufacturing the TFT is described with reference to FIGS. 5A to 5D and FIGS. 6A to 6C, a semiconductor device with higher added value can be manufactured by formation of various semiconductor elements such as a capacitor and a resistor together with the TFT. Hereinafter, a specific mode of the semiconductor device is described with reference to drawings.

Figure 7:
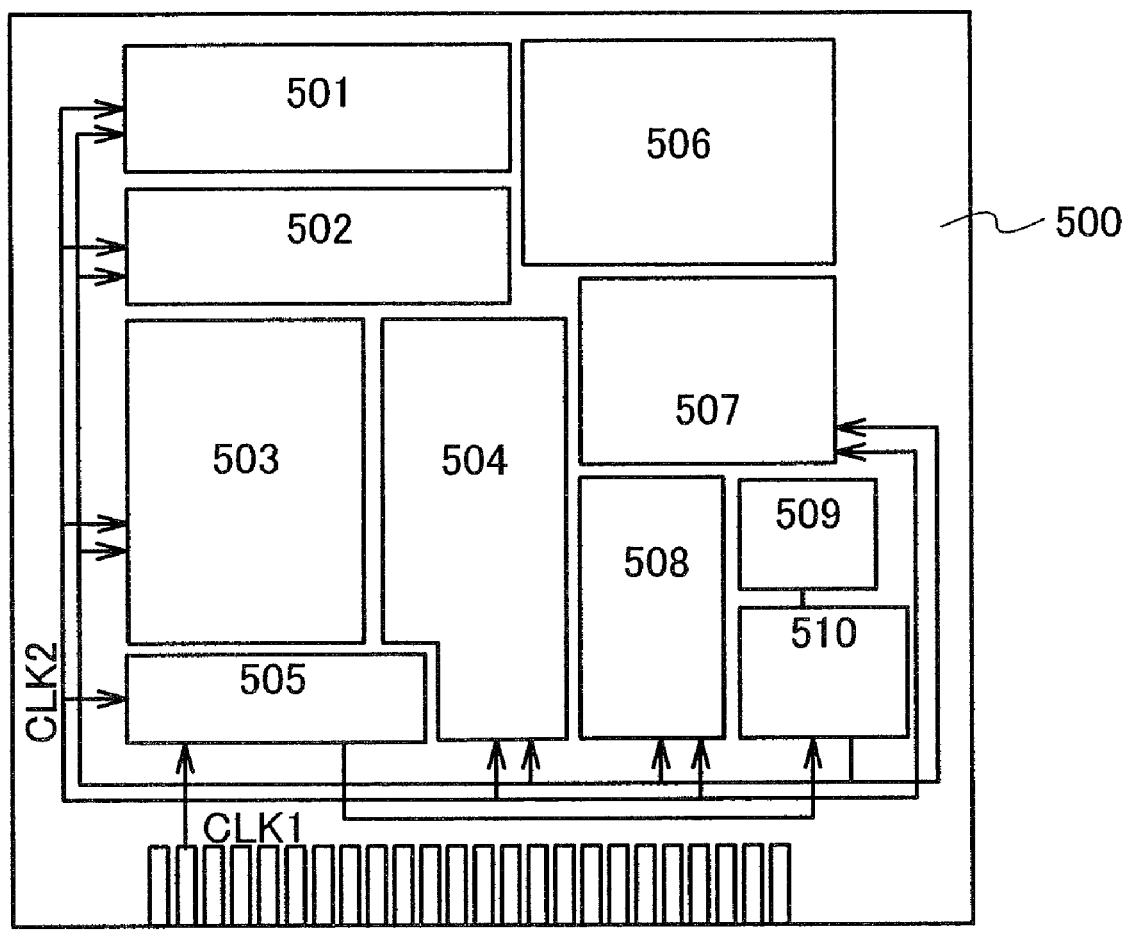
FIG. 7 is a diagram illustrating an example of a semiconductor device using an SOI substrate of the present invention.

First, a microprocessor will be described as an example of a semiconductor device. FIG. 7 is a block diagram illustrating a structural example of a microprocessor 500.

The microprocessor 500 has an arithmetic logic unit (also referred to as an "ALU") 501, an arithmetic logic unit controller (ALU controller) 502, an instruction decoder 503, an interrupt controller 504, a timing controller 505, a register 506, a register controller 507, a bus interface (Bus I/F) 508, a read only memory 509, and a memory interface 510.

An instruction inputted to the microprocessor 500 via the bus interface 508 is inputted to the instruction decoder 503 and decoded. Then, the instruction is inputted to the arithmetic logic unit controller 502, the interrupt controller 504, the register controller 507, and the timing controller 505. The arithmetic logic unit controller 502, the interrupt controller 504, the register controller 507, and the timing controller 505 perform various controls based on the decoded instruction.

The arithmetic logic unit controller 502 generates a signal for controlling the operation of the arithmetic logic unit 501. While the microprocessor 500 is executing a program, the interrupt controller 504 processes an interrupt request from an external input and output device or a peripheral circuit. The interrupt controller 504 judges the priority of the interrupt request or a mask state, and processes the interrupt request. The register controller 507 generates an address of the register 506, and reads and writes data from and to the register 506 in accordance with the state of the microprocessor 500. The timing controller 505 generates signals for controlling timing of driving of the arithmetic logic unit 501, the arithmetic logic unit controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 7, the internal clock signal CLK2 is inputted to another circuit.

Figure 8:
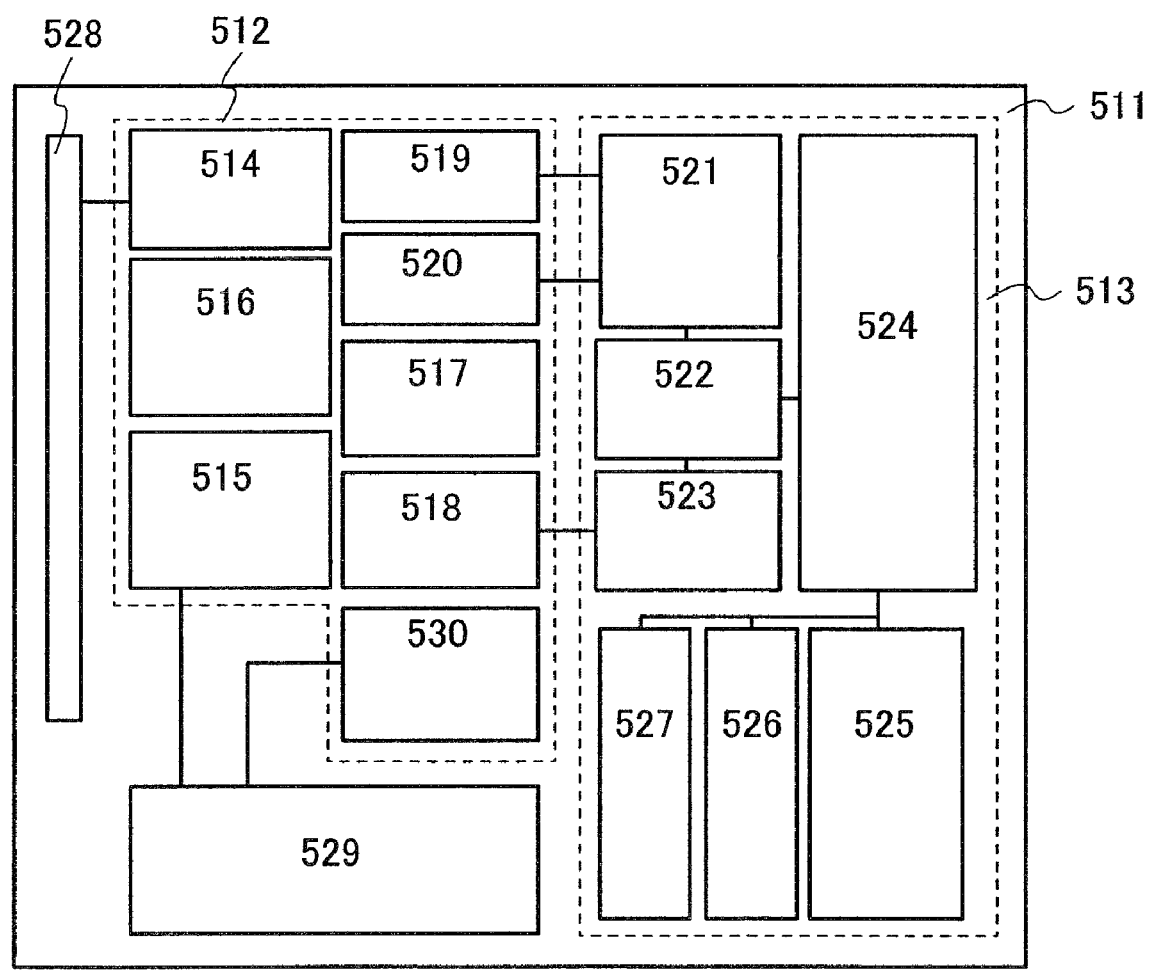
FIG. 8 is a diagram illustrating an example of a semiconductor device using an SOI substrate of the present invention.

Next, an example of a semiconductor device having a function of transmitting and receiving data wirelessly and also having an arithmetic function is described. FIG. 8 is a block diagram illustrating a structural example of such a semiconductor device. The semiconductor device illustrated in FIG. 8 can be referred to as a computer (hereinafter referred to as an "RFCPU") which operates by transmitting and receiving signals to and from an external device by wireless communication.

As illustrated in FIG. 8, an RFCPU 511 has an analog circuit portion 512 and a digital circuit portion 513. The analog circuit portion 512 has a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 has an RF interface 521, a control register 522, a clock controller 523, a CPU interface 524, a central processing unit 525, a random access memory 526, and a read only memory 527.

The operation of the RFCPU 511 is roughly described below. Induced electromotive force is generated by the resonance circuit 514 based on a signal received by an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as another component.

The reset circuit 517 generates a signal which resets the digital circuit portion 513 to be initialized. For example, a signal which rises after an increase in a power supply voltage is generated as the reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal which is inputted to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method can be employed in which the read only memory 527 stores an operating system (OS) and a program is read at the time of starting operation and then is executed. Alternatively, a method can be employed in which a circuit dedicated to arithmetic is formed as an arithmetic circuit and an arithmetic processing is conducted using hardware. In a method in which both hardware and software are used, part of arithmetic processing can be conducted by a circuit dedicated to arithmetic, and the other part of the arithmetic processing can be conducted by the central processing unit 525 with use of a program.

Next, a display device will be described as a semiconductor device with reference to FIGS. 10A and 10B, and FIGS. 11A and 11B.

Figure 10A:
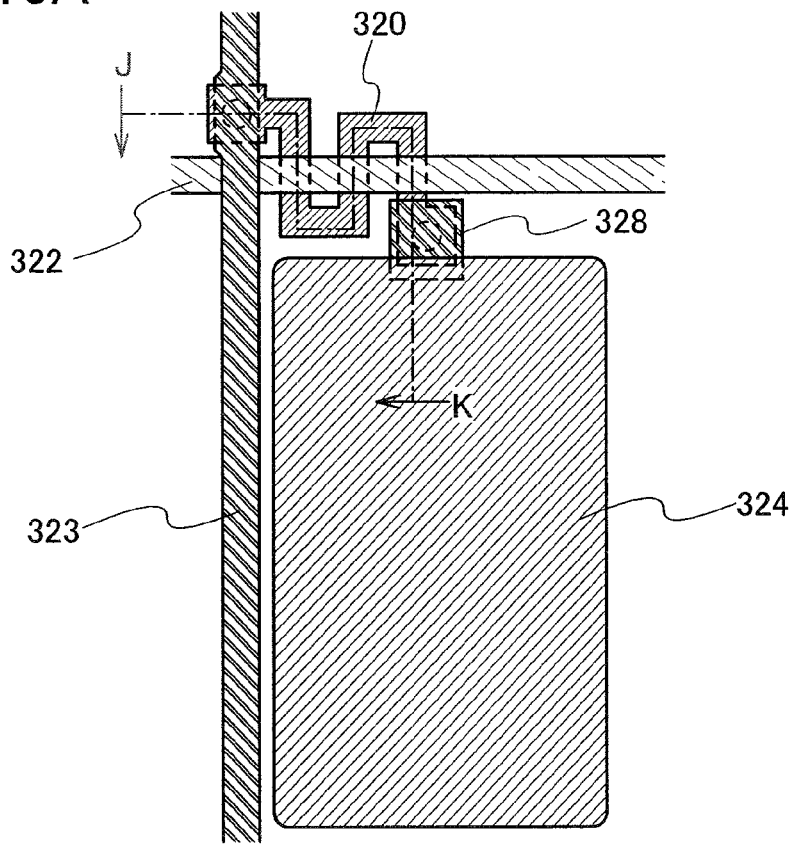
FIGS. 10A and 10B are views illustrating an example of a display device using an SOI substrate of the present invention.
Figure 10B:
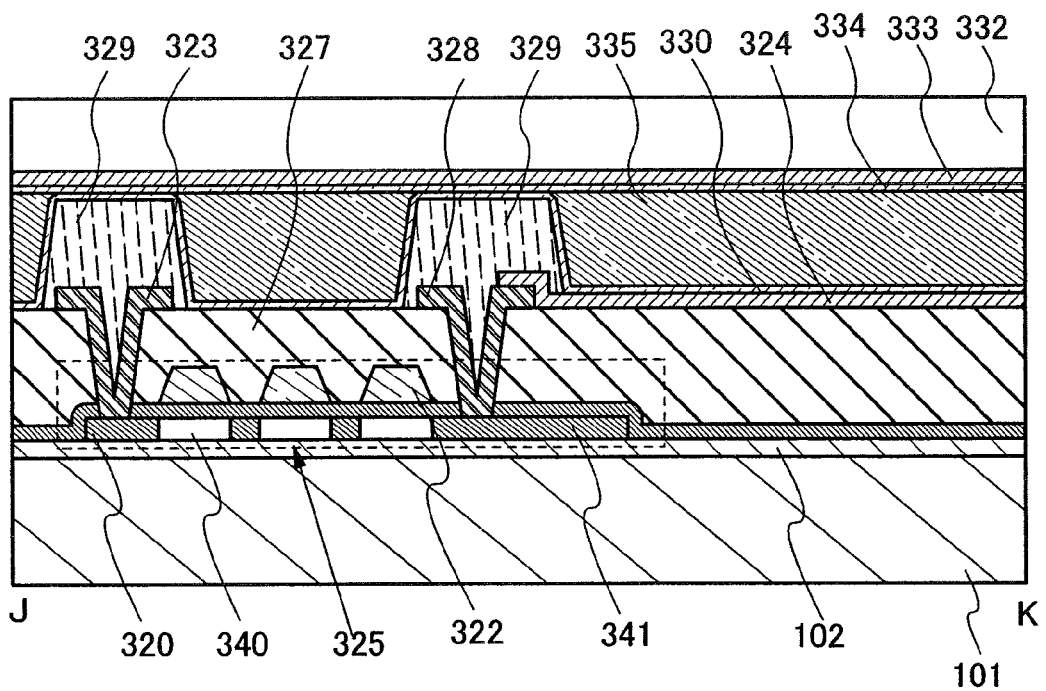

FIGS. 10A and 10B are drawings for describing a liquid crystal display device. FIG. 10A is a plan view of a pixel of a liquid crystal display device. FIG. 10B is a cross-sectional view taken along a line J-K of FIG. 10A.

As illustrated in FIG. 10A, a pixel includes a single crystal semiconductor film 320, a scanning line 322 intersecting with the single crystal semiconductor film 320, a signal line 323 intersecting with the scanning line 322, a pixel electrode 324, and an electrode 328 which electrically connects the pixel electrode 324 to the single crystal semiconductor film 320. The single crystal semiconductor film 320 is formed of the single crystal semiconductor film 302 bonded to the SOI substrate and is included in a TFT 325 of the pixel.

As an SOI substrate, the SOI substrate described in the above embodiment modes is used. As illustrated in FIG. 10B, the insulating film 102 and the single crystal semiconductor film 320 are stacked over the first substrate 101. The first substrate 101 is made of glass. A semiconductor film of the SOI substrate is separated for each element by etching, whereby the single crystal semiconductor film 320 of the TFT 325 is formed. A channel formation region 340 and n-type high-concentration impurity regions 341 into which donors are added are formed in the single-crystal semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over an interlayer insulating film 327. Column spacers 329 are formed over the interlayer insulating film 327. An orientation film 330 is formed to cover the signal line 323, the pixel electrode 324, the electrode 328, and the column spacers 329. A counter substrate 332 is provided with a counter electrode 333 and an orientation film 334 which covers the counter electrode 333. The column spacers 329 are formed to fill spaces between the first substrate 101 and the counter substrate 332. A liquid crystal layer 335 is formed in a space which is formed by the column spacers 329. The interlayer insulating film 327 has a step at the connection portion between the high-concentration impurity regions 341, and the signal line 323 and the electrode 328 due to formation of contact holes; therefore, orientation of liquid crystals in the liquid crystal layer 335 is easily disordered at this connection portion. Therefore, the column spacers 329 are formed at the step portions to prevent the disorder of the orientation of liquid crystals.

Figure 11A:
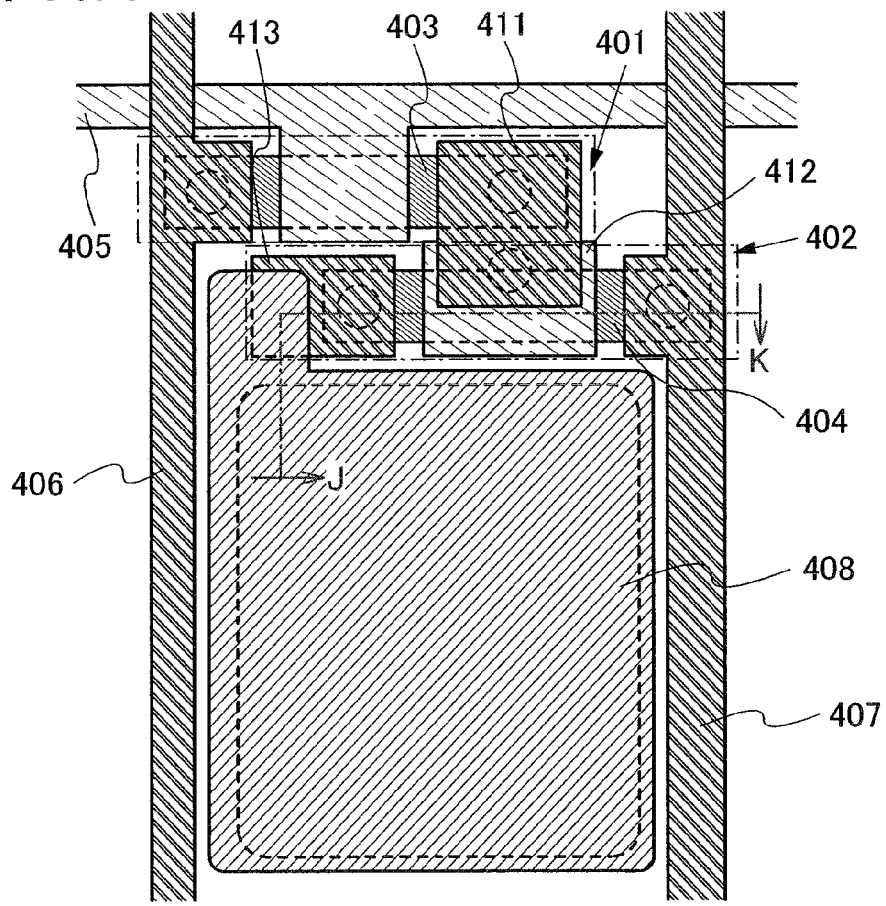
FIGS. 11A and 11B are views illustrating an example of a display device using an SOI substrate of the present invention.
Figure 11B:
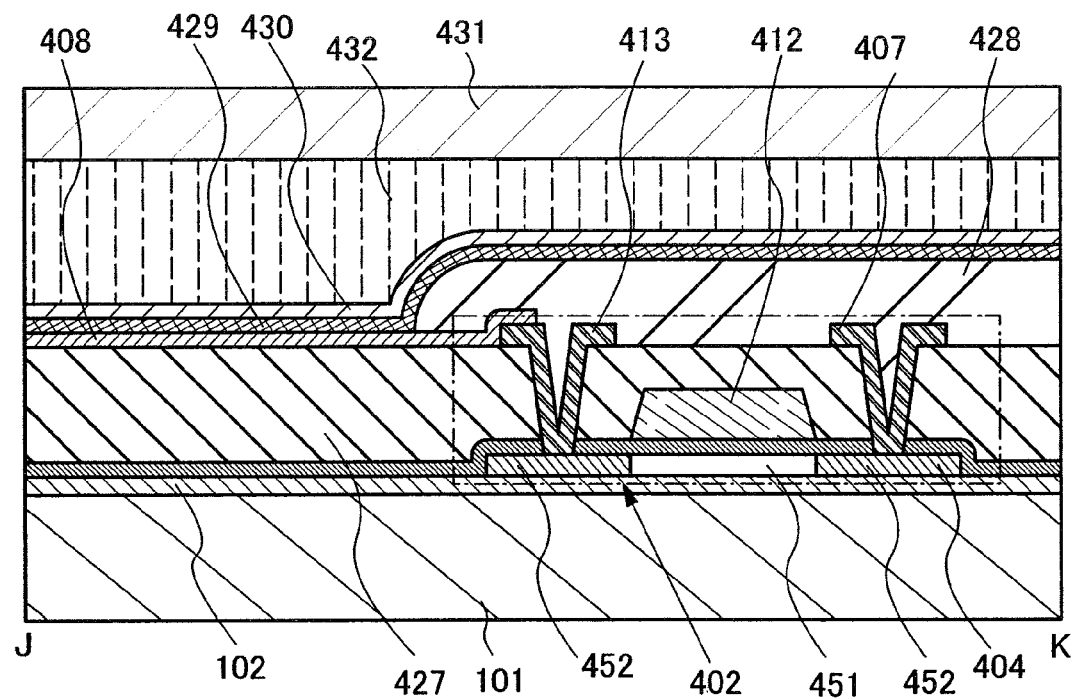

Next, an electroluminescent display device (hereinafter referred to as an "EL display device") will be described with reference to FIGS. 11A and 11B. FIG. 11A is a plan view of a pixel of an EL display device. FIG. 11B is a cross-sectional view taken along a line J-K of FIG. 11A.

As illustrated in FIG. 11A, a pixel includes a selection transistor 401 and a display control transistor 402 each including a TFT, a scanning line 405, a signal line 406, a current supply line 407, and a pixel electrode 408. Each pixel is provided with a light-emitting element having a structure in which a layer containing an electroluminescent material (an EL layer) is sandwiched between a pair of electrodes. One electrode of the light-emitting element is the pixel electrode 408. Further, in a semiconductor layer 403, a channel formation region, a source region, and a drain region of the selection transistor 401 are formed. Further, in a semiconductor film 404, a channel formation region, a source region, and a drain region of the display control transistor 402 are formed. The semiconductor films 403 and 404 are formed of the single crystal semiconductor film 302 bonded to the SOI substrate.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 11B, a channel formation region 451 and p-type high-concentration impurity regions 452 are formed in the semiconductor layer 404. As an SOI substrate, an SOI substrate manufactured by the method according to Embodiment Mode 1 is used.

An interlayer insulating film 427 is formed so as to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 which has an insulating property. An EL layer 429 is formed over the pixel electrode 408, and a counter electrode 430 is formed over the EL layer 429. A counter substrate 431 is provided as a reinforcing plate and is fixed to the first substrate 101 by a resin layer 432.

The grayscale of the EL display device is controlled by either a current driving method by which the luminance of the light-emitting element is controlled by the amount of current or a voltage driving method by which control is performed basically by the amount of voltage. The current driving method is difficult to be employed when transistors have characteristic values which are largely different in each pixel, and thus a compensation circuit for compensating the variation in the characteristics is needed. The EL display device is manufactured by a manufacturing process of an SOI substrate and a manufacturing method including a gettering step, so that the selection transistor 401 and the display control transistor 402 do not have variation in characteristics in each pixel. Thus, the current driving method can be employed.

That is, various electric devices can be manufactured using the SOI substrates. The electric devices include, in its category, cameras such as video cameras, digital cameras, navigation systems, audio reproducing devices (such as car audios or audio components), computers, game machines, portable information terminals (such as mobile computers, cellular phones, portable game machines, or e-book readers), and image reproducing devices having storage media (specifically, devices provided with display devices capable of playing audio data stored in recording media such as digital versatile disk (DVD) and displaying stored image data).

Figure 12A:
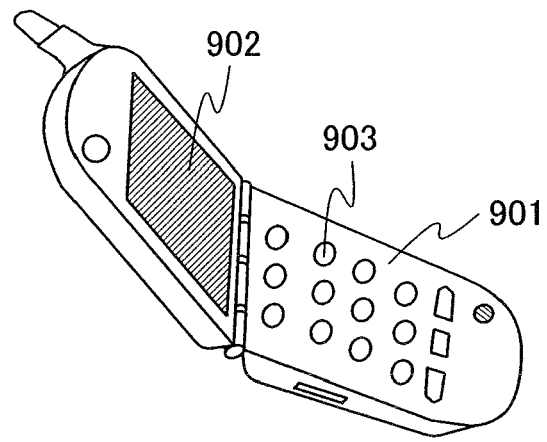
FIGS. 12A to 12C are views illustrating electronic devices using an SOI substrate of the present invention.

Specific modes of the electric devices are described with reference to FIGS. 12A to 12C. FIG. 12A is an external view illustrating an example of a cellular phone 901. This cellular phone 901 includes a display portion 902, operation switches 903, and the like. The liquid crystal display device illustrated in FIGS. 10A and 10B or the EL display device illustrated in FIGS. 11A and 11B is applied to the display portion 902, whereby the display portion 902 can have little display unevenness and excellent image quality.

Figure 12B:
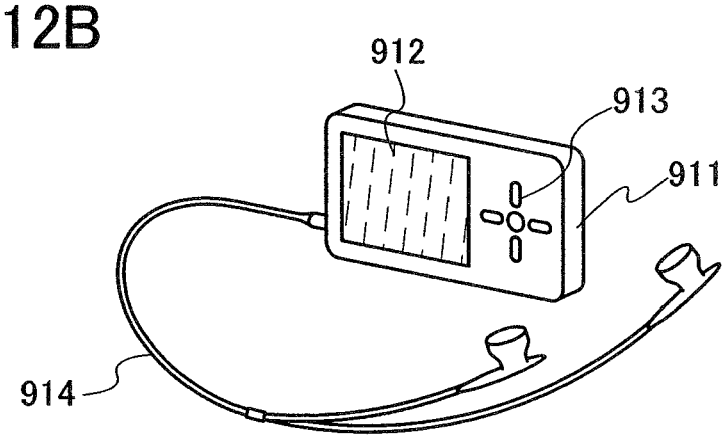

FIG. 12B is an external view illustrating a structural example of a digital player 911. The digital player 911 includes a display portion 912, an operation portion 913, earphones 914, and the like. The earphones 914 can be replaced by headphones or wireless earphones. The liquid crystal display device illustrated in FIGS. 10A and 10B or the EL display device illustrated in FIGS. 11A and 11B is applied to the display portion 912, whereby the display portion 912 can display high-definition images and a large amount of textual information even when the screen size ranges approximately from 0.3 inches to 2 inches.

Figure 12C:
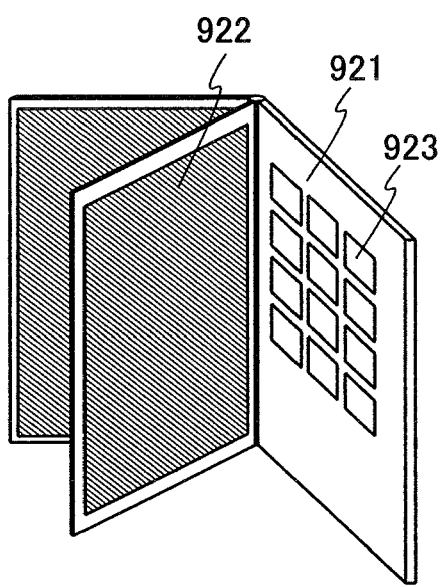

FIG. 12C is an external view of an e-book reader 921. This e-book reader 921 includes a display portion 922 and operation switches 923. The e-book reader 921 may incorporate a modem or may incorporate the RFCPU illustrated in FIG. 8 so that information can be transmitted and received wirelessly. The liquid crystal display device illustrated in FIGS. 10A and 10B or the EL display device illustrated in FIGS. 11A and 11B is applied to the display portion 922, whereby the display portion 922 can display high-quality images.

Note that the method for manufacturing an SOI substrate described in this embodiment mode can be combined with manufacturing methods in other embodiment modes in this specification, as appropriate.

Embodiment 1

In this embodiment, in manufacture of an SOI substrate, crystallinity before and after heat treatment in the case where heat treatment is performed after an amorphous semiconductor film is formed over a single crystal semiconductor film of an SOI substrate after separation will be described.

First, a single crystal semiconductor substrate (here a silicon wafer) which serves as a separation substrate was prepared, a silicon oxynitride film was formed to a thickness of 100 nm over the single crystal semiconductor substrate by a plasma CVD method, and then a silicon nitride oxide film was formed to a thickness of 50 nm. Next, hydrogen ions were added into the single crystal semiconductor substrate by an ion doping method to form a separation layer. The hydrogen doping was performed under the conditions where a hydrogen gas was used, the acceleration voltage was 25 kV, the RF power was 100 W, and the dose was $2.2 \times 10^{16}$ ion/cm$^2$. Next, an insulating film functioning as a bonding layer was formed over the silicon nitride oxide film. Here, as the insulating film functioning as a bonding layer, a silicon oxide film was formed to a thickness of 50 nm by a CVD method using organosilane (TEOS: $Si(OC_2H_5)_4$) as a source gas. Next, a glass substrate was prepared, and a surface of the glass substrate and a surface of the insulating film functioning as a bonding layer which had been formed over the single crystal semiconductor substrate were bonded to each other (see FIG. 13A). Next, heat treatment (heat treatment at 200° C. for 2 hours, and then heat treatment at 600° C. for 4 hours) was performed to cause cleavage at the separation layer, so that a single crystal silicon film was formed over the glass substrate (see FIG. 13B). Note that the single crystal silicon film was formed over the glass substrate with the silicon oxynitride film, the silicon nitride oxide film, and the silicon oxide film interposed therebetween (see FIG. 13C).

Next, an amorphous silicon (a-Si) film was formed to a thickness of 40 nm over the single crystal silicon film which had been formed over the glass substrate by a CVD method (see FIG. 13D). After that, heat treatment was performed at 750° C. for 3 minutes with an RTA (rapid thermal anneal) apparatus to crystallize the a-Si film (see FIG. 13E).

Figure 14:
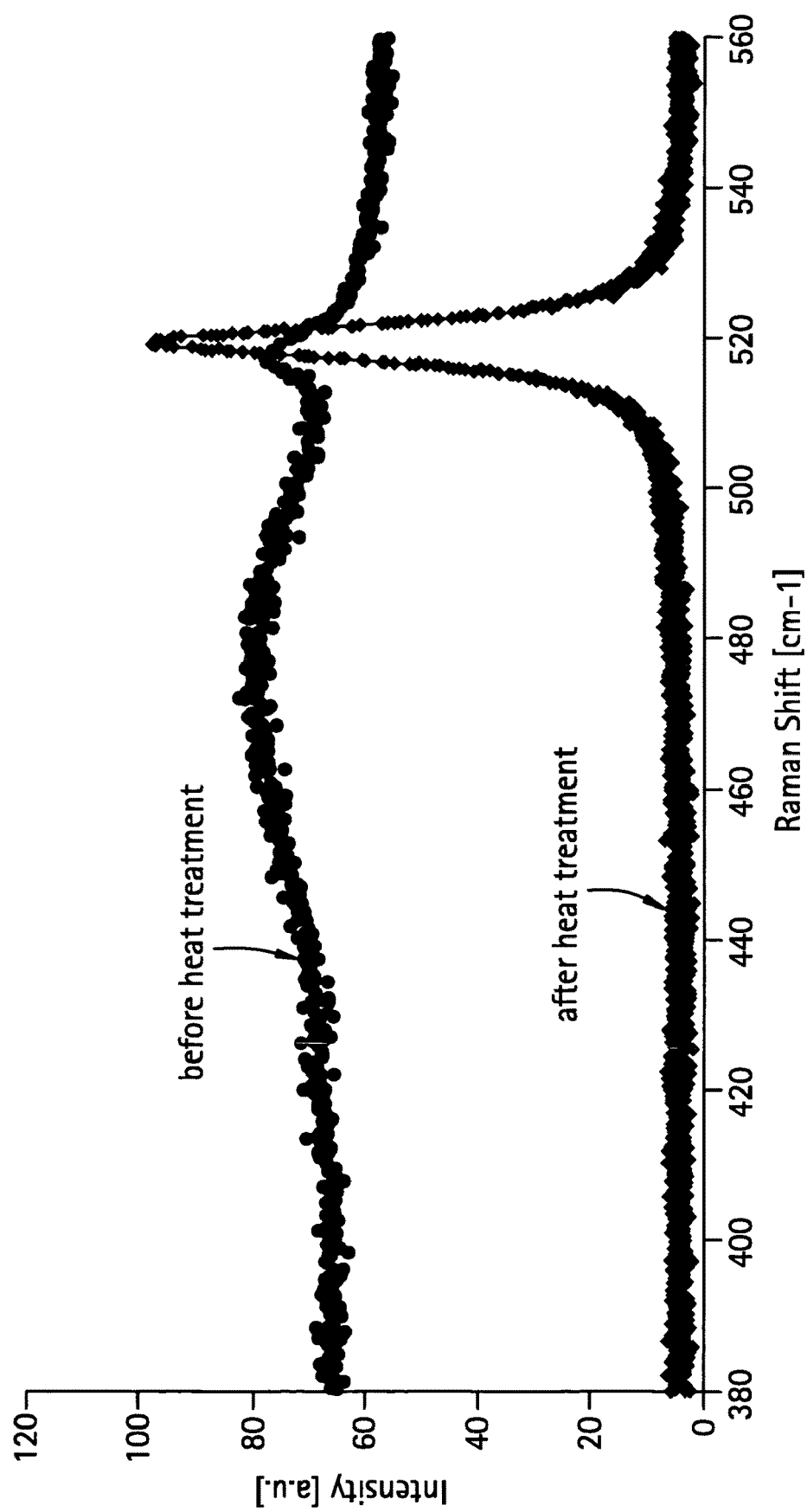
FIG. 14 is a graph showing the results of the Raman spectroscopy of a semiconductor film before and after heat treatment.

FIG. 14 illustrates the results of Raman spectroscopy on the crystallinity of the deposited semiconductor film before and after the heat treatment.

As illustrated in FIG. 14, before the heat treatment, a small single crystal peak of 520.6 cm$^{-1}$ and a broad peak of 440 cm$^{-1}$ to 500 cm$^{-1}$ which shows amorphousness were observed. After the heat treatment, on the other hand, only a Raman peak (520.6 cm$^{-1}$) which shows single crystallinity of silicon was observed. Accordingly, it was found that the amorphous silicon formed over the single crystal silicon film was crystallized into a single crystal silicon film to which stress was not applied by the heat treatment.

Next, the crystal plane orientation of the deposited semiconductor film before and after the heat treatment is described with reference to FIGS. 15A to 15C. FIGS. 15A and 15B are each an inverse pole figure (IPF) map obtained from measurement data of an electron back scatter diffraction pattern (EBSP) of a surface of the silicon film. FIG. 15A is the IPF map of the silicon film on which the heat treatment was not performed after the deposition of amorphous silicon, whereas FIG. 15B is the IPF map of the silicon film on which the heat treatment was performed after the deposition of amorphous silicon. FIG. 15C is a color-coded map showing the relationship between colors of the IPF maps and crystal orientations, in which each orientation of the crystal is color-coded. Note that the measurement area was 40 μm×40 μm.

According to the IPF maps of FIGS. 15A and 15B, it was observed that the plane orientations after the deposition of the a-Si film were random, whereas after the heat treatment, a single crystal silicon film in which there was no crystal boundary and whose crystal axes were aligned in the <100> direction was obtained.

According to the above-described result, it was found that an a-Si film is crystallized by being epitaxially grown (solid phase grown) using a single crystal silicon film as a seed layer even when heat treatment is performed after the a-Si film is deposited over the single crystal silicon film.

Embodiment 2

In this embodiment, in manufacture of an SOI substrate, planarization of a surface in the case where heat treatment is performed after an amorphous semiconductor film is formed over a single crystal semiconductor film of an SOI substrate after separation will be described.

In this embodiment, a surface after deposition of the a-Si film and the heat treatment after the separation (see FIG. 13E) in a similar manner to the above Embodiment 1 was observed using a scanning electron microscope (SEM). In addition, for comparison, a surface of the single crystal silicon film after the separation (see FIG. 13C) was observed using the SEM.

Figure 16A:
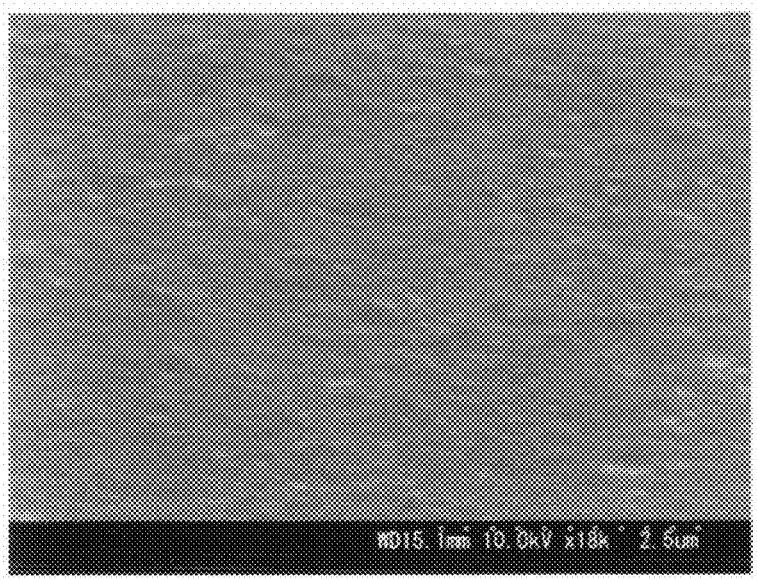
FIGS. 16A and 16B are views showing the SEM images of a surface of a semiconductor film which is solid phase grown.
Figure 16B:
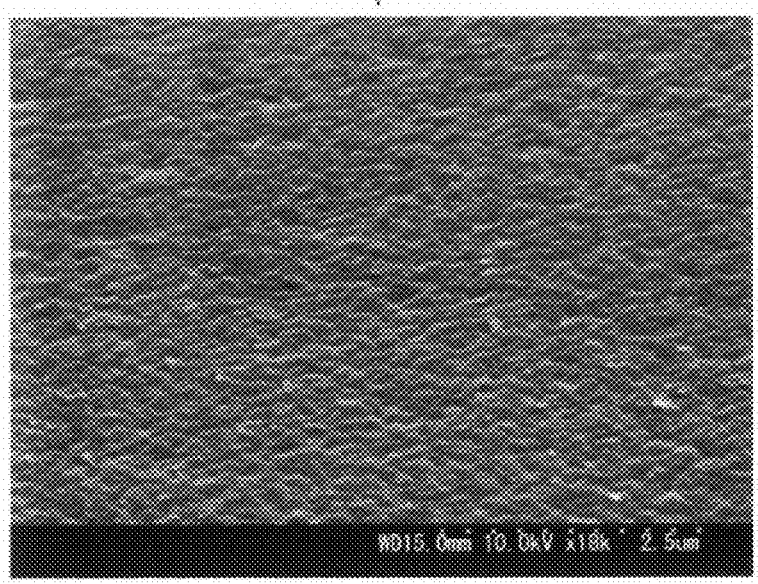

FIG. 16A is a SEM image of a surface of the SOI substrate after the a-Si film was formed and heat treatment was performed after the separation. FIG. 16B is a SEM image of the surface of the SOI substrate after the separation as a comparative example.

As shown in FIG. 16B, unevenness was observed on the surface of the SOI substrate after the separation. On the other hand, it was observed that unevenness of the surface of the SOI substrate on which the heat treatment was performed after the formation of the a-Si film was reduced to be flat in comparison with the surface of the SOI substrate after the separation. It is thought that this is because the a-Si film was formed so as to reduce unevenness of the surface of the deposited single crystal silicon film.

This application is based on Japanese Patent Application serial No. 2007-312668 filed with Japan Patent Office on Dec. 3, 2007, the entire contents of which are hereby incorporated by reference.

What is claimed is:

1. A method for manufacturing an SOI substrate comprising the steps of:
   preparing a first SOI substrate in which a first single crystal semiconductor film is provided over a first substrate with a first insulating film interposed therebetween;
   preparing a second substrate formed of the same material as the first substrate;
   forming a second single crystal semiconductor film over the first single crystal semiconductor film;
   forming a separation layer by addition of ions into the second single crystal semiconductor film;
   forming a second insulating film over the second single crystal semiconductor film;

bonding a surface of the second insulating film to a surface of the second substrate; and performing heat treatment to the separation layer to cause cleavage at the separation layer, so that a second SOI substrate in which a part of the second single crystal semiconductor film is provided over the second substrate with the second insulating film interposed therebetween is formed.

2. The method for manufacturing an SOI substrate according to claim 1, wherein a glass substrate is used as the first substrate and the second substrate.

3. The method for manufacturing an SOI substrate according to claim 1, wherein the second single crystal semiconductor film is crystallized by solid-phase growth of a semiconductor film by heat treatment after formation of the semiconductor film over the first single crystal semiconductor film.

4. The method for manufacturing an SOI substrate according to claim 3, wherein an amorphous semiconductor film is used as the semiconductor film.

5. The method for manufacturing an SOI substrate according to claim 1, wherein the second single crystal semiconductor film is formed by a gas-phase growth of a semiconductor film formed over the first single crystal semiconductor film by a CVD method.

6. The method for manufacturing an SOI substrate according to claim 1, wherein the first substrate is made of an insulating material.

7. The method for manufacturing an SOI substrate according to claim 1, further comprising a step of planarization on one or both of a surface of the second single crystal semiconductor film remaining over the first substrate and a surface of the second single crystal semiconductor film provided over the second substrate.

8. A method for manufacturing an SOI substrate comprising the steps of:
preparing a semiconductor substrate which comprises a first insulating film formed on its surface, a first separation layer formed at a predetermined depth, and a first substrate;
preparing a second substrate formed of the same material as the first substrate;
bonding a surface of the first insulating film to a surface of the second substrate;
performing heat treatment to the first separation layer to cause cleavage at the first separation layer, so that a first SOI substrate in which a first single crystal semiconductor film provided over the second substrate with the first insulating film interposed therebetween is formed;
forming a second single crystal semiconductor film over the first single crystal semiconductor film;
forming a second separation layer by addition of ions into the second single crystal semiconductor film;
forming a second insulating film over the second single crystal semiconductor film;
bonding a surface of the second insulating film to a surface of a third substrate formed of the same material as the first substrate; and
performing heat treatment to the second separation layer to cause cleavage at the second separation layer, so that a second SOI substrate in which a part of the second single crystal semiconductor film provided over the third substrate with the second insulating film interposed therebetween is formed.

9. The method for manufacturing an SOI substrate according to claim 8, wherein a glass substrate is used as the first substrate and the second substrate.

10. The method for manufacturing an SOI substrate according to claim 8, wherein the second single crystal semiconductor film is crystallized by solid-phase growth of a semiconductor film by heat treatment after formation of the semiconductor film over the first single crystal semiconductor film.

11. The method for manufacturing an SOI substrate according to claim 10, wherein an amorphous semiconductor film is used as the semiconductor film.

12. The method for manufacturing an SOI substrate according to claim 8, wherein the second single crystal semiconductor film is formed by a gas-phase growth of a semiconductor film formed over the first single crystal semiconductor film by a CVD method.

13. The method for manufacturing an SOI substrate according to claim 8, wherein the first substrate is made of an insulating material.

14. The method for manufacturing an SOI substrate according to claim 8, further comprising a step of planarization on one or more of a surface of the first single crystal semiconductor film remaining over the first substrate, a surface of the first single crystal semiconductor film provided over the second substrate, a surface of the second crystal semiconductor film remaining on the second substrate and a surface of the second single crystal semiconductor film provided over the third substrate.

15. A method for manufacturing an SOI substrate comprising:
a first process comprising the steps of:
preparing a first SOI substrate in which a first single crystal semiconductor film is provided over a first substrate with a first insulating film interposed therebetween;
preparing a second substrate formed of the same material as the first substrate;
forming a second single crystal semiconductor film over the first single crystal semiconductor film;
forming a separation layer by addition of ions into the second single crystal semiconductor film; and
forming a second insulating film over the second single crystal semiconductor film, and
a second process comprising the steps of:
bonding a surface of the second insulating film to a surface of the second substrate; and
performing heat treatment to the separation layer to cause cleavage at the separation layer, so that a second SOI substrate in which a part of the second single crystal semiconductor film is provided over the second substrate with the second insulating film interposed therebetween is formed,
wherein the second SOI substrate formed in the second process is used as the first SOI substrate in the first process.

16. The method for manufacturing an SOI substrate according to claim 15, wherein planarization treatment is performed on one or both of a surface of the second single crystal semiconductor film remaining over the first substrate and a surface of the second single crystal semiconductor film formed over the second substrate.

17. The method for manufacturing an SOI substrate according to claim 16, wherein laser light irradiation is performed for the planarization treatment.

18. The method for manufacturing an SOI substrate according to claim 15, wherein a glass substrate is used as the first substrate and the second substrate.

19. The method for manufacturing an SOI substrate according to claim 15, wherein the second single crystal semiconductor film is crystallized by solid-phase growth of a semiconductor film by heat treatment after formation of the semiconductor film over the first single crystal semiconductor film.

20. The method for manufacturing an SOI substrate according to claim 19, wherein an amorphous semiconductor film is used as the semiconductor film.

21. The method for manufacturing an SOI substrate according to claim 15, wherein the second single crystal semiconductor film is formed by a gas-phase growth of a semiconductor film formed over the first single crystal semiconductor film by a CVD method.

22. The method for manufacturing an SOI substrate according to claim 15, wherein the first substrate is made of an insulating material.

* * * * *